(12) United States Patent
Jang et al.

(10) Patent No.: US 12,097,685 B2
(45) Date of Patent: *Sep. 24, 2024

(54) FILMS, LIGHT TRANSMITTING LAMINATE, COVER FILMS AND MULTI-LAYERED ELECTRONIC DEVICES

(71) Applicants: SK microworks Co., Ltd., Suwon-si (KR); ARKEMA FRANCE, Colombes (FR)

(72) Inventors: Kwangho Jang, Seoul (KR); Kweonhyung Han, Suwon-si (KR); Jinwoo Park, Seoul (KR); Atsushi Yoshitake, Kyoto (JP)

(73) Assignees: SK microworks Co., Ltd., Suwon-si (KR); ARKEMA FRANCE, Colombes (FR)

( * ) Notice: Subject to any disclaimer, the term of this patent is extended or adjusted under 35 U.S.C. 154(b) by 0 days.

This patent is subject to a terminal disclaimer.

(21) Appl. No.: 17/874,647

(22) Filed: Jul. 27, 2022

(65) Prior Publication Data
US 2023/0097930 A1     Mar. 30, 2023

(30) Foreign Application Priority Data

Jul. 27, 2021   (KR) .................. 10-2021-0098567
Jul. 27, 2021   (KR) .................. 10-2021-0098568

(51) Int. Cl.
*B32B 27/08*     (2006.01)
*B32B 17/10*     (2006.01)
(Continued)

(52) U.S. Cl.
CPC ............. *B32B 27/08* (2013.01); *B32B 17/10* (2013.01); *B32B 27/281* (2013.01); *B32B 27/34* (2013.01);
(Continued)

(58) Field of Classification Search
CPC ....... B32B 27/08; B32B 17/10; B32B 27/281; B32B 27/34; B32B 37/10; B32B 37/203;
(Continued)

(56) References Cited

U.S. PATENT DOCUMENTS

2009/0324884 A1*  12/2009  Nishi ............... B29C 55/023
                                                    428/137
2012/0022490 A1*  1/2012   Marche .............. B32B 3/266
                                                    604/391

(Continued)

FOREIGN PATENT DOCUMENTS

CN    102079867 A    6/2011
CN    105348522 A    2/2016
(Continued)

*Primary Examiner* — Travis M Figg
(74) *Attorney, Agent, or Firm* — NSIP Law

(57) ABSTRACT

Example embodiments relates to a film having excellent mechanical properties with excellent optical properties such as refractive index, haze, yellow index, and the like, light transmitting laminate, use as a cover film, a multi-layered electronic device, and the like comprising the same.

The film comprises an elastic layer, the elastic layer has a refractive index of 1.48 to 1.58, a low temperature damage index is a difference of a tensile modulus and a tensile strength at a certain temperature, and the elastic layer has a low temperature index of 1,300 MPa or less.

11 Claims, 5 Drawing Sheets

(51) Int. Cl.
*B32B 27/28* (2006.01)
*B32B 27/34* (2006.01)
*B32B 37/10* (2006.01)
*B32B 37/20* (2006.01)

(52) U.S. Cl.
CPC ............ B32B 37/10 (2013.01); B32B 37/203 (2013.01); *B32B 2307/412* (2013.01); *B32B 2307/51* (2013.01); *B32B 2307/536* (2013.01); *B32B 2307/538* (2013.01); *B32B 2307/54* (2013.01); *B32B 2307/732* (2013.01); *B32B 2367/00* (2013.01); *B32B 2377/00* (2013.01); *B32B 2457/20* (2013.01)

(58) Field of Classification Search
CPC .......... B32B 2307/412; B32B 2307/51; B32B 2307/536; B32B 2307/538; B32B 2307/54; B32B 2307/732; B32B 2367/00; B32B 2377/00; B32B 2457/20
See application file for complete search history.

(56) References Cited

U.S. PATENT DOCUMENTS

| | | | | |
|---|---|---|---|---|
| 2014/0302947 A1* | 10/2014 | Sullivan | ............. | A63B 37/0051 473/374 |
| 2014/0323243 A1* | 10/2014 | Sullivan | ................. | C08L 51/06 428/402 |
| 2015/0182807 A1* | 7/2015 | Bulpett | ............. | A63B 37/0049 473/373 |
| 2015/0361258 A1* | 12/2015 | Mohanty | .................... | C08J 5/00 525/92 A |
| 2016/0325147 A1* | 11/2016 | Sullivan | ................. | C08G 69/40 |
| 2018/0264325 A1* | 9/2018 | Bulpett | ............. | A63B 37/0063 |

FOREIGN PATENT DOCUMENTS

| | | |
|---|---|---|
| JP | 2006-326887 A | 12/2006 |
| JP | 2009-300506 A | 12/2009 |
| JP | 2019-14255 A | 1/2019 |
| JP | 2020-167085 A | 10/2020 |
| JP | 2020-203481 A | 12/2020 |
| JP | 2021-55094 A | 4/2021 |
| JP | 2021-88181 A | 6/2021 |
| KR | 10-2016-0080790 A | 7/2016 |
| KR | 10-1730854 B1 | 4/2017 |
| KR | 10-1746170 B1 | 6/2017 |
| KR | 10-2017-0109833 A | 10/2017 |
| KR | 10-2017-0120982 A | 11/2017 |
| KR | 10-2019-0100966 A | 8/2019 |
| KR | 10-2020-012206 A | 8/2020 |
| KR | 10-2147319 B1 | 8/2020 |
| KR | 10-2169467 B1 | 10/2020 |
| KR | 10-2276136 B1 | 7/2021 |
| WO | WO 2018/079161 A1 | 5/2018 |
| WO | WO 2021/088181 A1 | 5/2021 |
| WO | WO 2021/108174 A1 | 6/2021 |

\* cited by examiner

FILMS, LIGHT TRANSMITTING LAMINATE, COVER FILMS AND MULTI-LAYERED ELECTRONIC DEVICES

CROSS-REFERENCE TO RELATED APPLICATIONS

This application claims the benefit under 35 U.S.C. 119(a) of Korean Patent Application Nos. 10-2021-0098568 filed on Jul. 27, 2021, and 10-2021-0098567 filed on Jul. 27, 2021, in the Korean Intellectual Property Office, the entire disclosures of which are incorporated herein by reference for all purposes.

1. Field of the Disclosure

The present disclosure relates to films having good mechanical properties and good optical properties such as refractive index, haze, yellow index, and the like, light transmitting laminate, uses as a cover film, multi-layered electronic devices including the same and the like.

2. Related Art

The forms of display devices are diversified, and the required functions are changing, and the evolution to a wider screen, a thinner and more functional form is in progress. Since the form of the display has evolved from the conventional flat form to the curved form, it has been changed into a foldable, bendable, flexible, and the like. In other words, in recent years, the form of the display is changing to a form different from the existing one that simply evolved toward large area in that it can be changed in form such as folding or bending.

PET films having excellent properties such as mechanical properties, chemical resistance, and moisture barrier properties are widely used as film for display screen protection. Examples thereof include a polyester protective film (Korean Registration No. 10-1730854) that can be applied as a protective film of a polarizing plate with improved optical properties, and a protective film (Korean Registration No. 10-1746170) applicable to a touch panel. However, PET film may not satisfy the characteristics required in the curved surface or the bent portion due to the high modulus, which may be one of the causes of the film floating in a multi-layer display device.

In addition, PET film has limitations in performing enough protective functions because of its weak shock-relief characteristics compared to the rigid glass previously used to protect display modules of display devices mounted on portable electronic devices.

The above-described background technology is technical information possessed by the inventors to derive embodiments of the present invention or acquired in the process and is not necessarily known technology disclosed to the general public before the present disclosure.

SUMMARY

It is an object of one embodiment to provide a film having good optical properties such as proper refractive index, low haze, high light transmittance, low retardation, and the like, a laminated film, a light transmitting laminate, a cover film, and the like.

It is an object of another embodiment to provide a light transmitting laminate or a cover film including the film for having excellent optical properties, having good mechanical properties such as a comparatively regular elastic characteristic over a wide temperature range, and thereby being advantageous to apply as a cover window of a multi-layered electronic device.

It is an object of another embodiment to provide uses of the film as cover windows such as foldable display, bendable display, flexible display, and the like.

It is an object of another embodiment to provide a multi-layered electronic device including the cover film with excellent optical properties such as proper refractive index, low haze, high light transmittance, low retardation, and the like, in which separation between layers does not occur even when repetitive bending or rolling was performed, having characteristics being strong on impact from an external.

It is an object of another embodiment to provide uses of the film described above as cover films applied in multi-layered electronic devices.

In a general aspect, one embodiment is a film including an elastic layer, and the elastic layer has a low temperature damage index of 1,300 MPa or less at −40° C.

The low temperature damage index is a difference of a tensile elastic modulus and a tensile strength at a certain temperature.

The elastic layer may have a tensile strength of 150 MPa or less at −40° C.

The elastic layer may have a tensile elastic modulus of 2,000 MPa or less at −40° C.

The elastic layer may have a tensile elastic modulus of 3,000 MPa or less at −10° C.

The elastic layer may have a storage modulus of 2,300 MPa or less at −40° C.

The elastic layer may have an elongation of 200% or more at −10° C.

The elastic layer may have a refractive index of 1.48 to 1.58.

The elastic layer may have a retardation Re of 300 nm or less.

The elastic layer may have a haze of 3% or less.

The elastic layer may have a light transmittance of 85% or more.

The roughness reference value is a larger value between Ra1 as a surface roughness Ra value of one side and Ra2 as a surface roughness Ra value of the other side.

The elastic layer may have a roughness reference value of 0.5 μm or less.

The elastic layer may contain an amide residue.

The elastic layer may include a polymer resin containing an amide residue.

The elastic layer may include a polymer resin containing an amide residue in an amount of 50 wt % or more as a repeating unit.

The film may include the elastic layer and a hardness layer disposed on one side of the elastic layer.

The refractive index of the elastic layer may be smaller than the refractive index of the hardness layer.

The difference between the refractive index of the elastic layer and the refractive index of the hardness layer may be 0.2 or less.

An adhesive layer may be further disposed on the other side of the elastic layer or between one side of the elastic layer and the hardness layer.

The refractive index of the elastic layer may be smaller than the refractive index of the adhesive layer.

The difference between the refractive index of the adhesive layer and the refractive index of the elastic layer may be 0.2 or less.

The difference between the refractive index of the adhesive layer and the refractive index of the hardness layer may be 0.2 or less.

The hardness layer may include a polyimide film or a glass layer.

The film may have a total thickness of 3,000 μm or less.

A light transmitting laminate according to another one embodiment includes a film described above.

The light transmitting laminate may further include a glass layer disposed on one side or the other side of the elastic layer.

The glass layer may be a tempered glass having a thickness of 200 μm or less.

A cover film according to another embodiment includes a film described above.

Another embodiment is a use of the film described above as a cover film.

Another embodiment is a use of the light transmitting laminate described above as a cover film.

The cover film may further include a glass layer disposed on one side and the other side.

The glass layer may be a tempered glass having a thickness of 200 μm or less.

A multi-layered electronic device according to another embodiment includes a film described above.

A multi-layered electronic device according to another embodiment includes a light emitting functional layer and a film, the light emitting functional layer has a display area which emits or does not emit light depending on external signals, and the film is disposed on an upper side or a rear side. The film is a film described above.

A multi-layered electronic device according to another embodiment includes a light emitting functional layer and a film, the light emitting layer has a display area which emits or does not emit light depending on external signals, the film is disposed on one side of the light transmitting functional layer and covering at least some of the display area, and the film described above may be applied as the film.

The film, light transmitting laminate, manufacturing method of the film, and the like of the embodiments may provide a film having good mechanical properties such as substantially low storage modulus variations over a wide temperature range, excellent elastic recovery force, and the like, with having good optical properties such as proper refractive index, low haze, high light transmittance, low retardation, and the like, and may provide an efficient method of manufacturing the film.

The cover film, multi-layered electronic device, and the like including the film of the embodiments may provide a cover film having excellent optical properties such as proper refractive index, low haze, high light transmittance, low retardation, and the like, with simultaneously having characteristics of excellent bending and rolling even in a wide temperature range, excellent elastic recovery force, an inhibitory effect for damage from external impact, and may provide a multi-layered electronic device including the same.

DETAILED DESCRIPTION

Figure 1A:
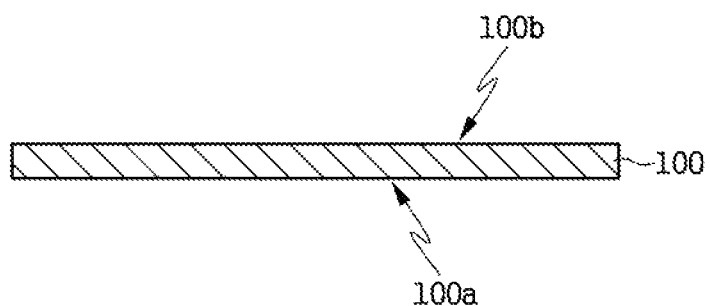
FIG. 1A, FIG. 1B and FIG. 1C show conceptual views of illustrating the film with sections, respectively, according to embodiments.

Hereinafter, embodiments of the present disclosure will be described in detail such that they can easily be made by those skilled in the art to which the present disclosure pertains. The present disclosure may, however, be embodied in many different forms and should not be construed as limited to exemplary embodiments set forth herein. Like reference numerals indicate like elements throughout the specification and drawings.

In the present specification, the phrase that a certain component "comprises" another component means that the certain component may further include one or more components but does not preclude the presence or addition of one or more other components, unless specifically stated to the contrary.

In the present specification, the phrase that a certain component is "connected" to another component includes not only 'directly connected' but also 'connected having other intervening components therebetween'.

In the present specification, I will be understood that when "B" is referred to as being on "A", ""B" can be directly on "A" or intervening other component(s) may be present therebetween. That is, the location of "B" is not construed as being limited to direct contact of "B" with the surface of "A".

In the present specification, the term "combination of" included in Markush type description means mixtures or combinations of one or more elements described in Markush type and thereby means that the disclosure includes one or more elements selected from the Markush group.

In the present specification, the description of "A and/or B" means "A, or B, or A and B."

In the present specification, the terms such as "first", "second" or "A", "B" are used to distinguish the same terms from each other, unless specifically stated otherwise.

In the present specification, the singular forms "a" "an" and "the" are intended to include the plural forms as well, unless context clearly indicates otherwise.

In the present specification, refractive index is presented by the result measured at 550 nm wavelength, unless specifically stated otherwise.

In the present specification, in-plane retardation Re or thickness direction retardation Rth is described based on the result measured at 550 nm wavelength by using a film sample with a thickness of 100 μm.

In the present specification, storage modulus is described based on the measurement of storage modulus (E') by applying TA instruments' DMA Q800 model in accordance with ASTM D4065. The apparatus is described based on the results of measuring the storage modulus (E') in Mpa units at a temperature range (−40 to 80° C.) by applying 1 Hz and 2° C./min in DMA (Dynamic Mechanical Analysis) tension mode.

In the present specification, a room temperature is based on about 20° C., and an ambient temperature is based on about 25° C.

In the present specification, in-plane retardation (Re) is a parameter defined by the product ($\Delta Nxy \times d$) of the anisotropy ($\Delta Nxy=|Nx-Ny|$) of refractive indices in two mutually orthogonal axes inside a plane of a film multiplied by a film thickness d (nm), and a measure showing an optical isotropy or anisotropy.

In the present specification, thickness direction retardation (Rth) is a parameter defined by the mean of retardation values obtained by multiplying a film thickness d and respective $\Delta Nxz(=|Nx-Nz|)$ and $\Delta Nyz(=|Ny-Nz|)$ that are two double refraction values when observed at a section in a film thickness direction.

In the present specification, hardness layer refers to a layer having a surface hardness of H or above.

In the present specification, letters and/or numbers written in combination with the name of the compound mean an abbreviation for the name of the compound.

In the present specification, relative size, thickness, and the like of the components showed in drawings may be presented with exaggeration for easy description.

Hereinafter, the example embodiments will be described in more detail.

The inventors of the example embodiments verified that it was possible to provide a film having an excellent tensile characteristic in a low temperature and simultaneously having excellent optical properties such as high light transmittance, low haze, proper refractive index, retardation characteristic, UV durability, and the like by manufacturing an elastic layer in a film shape, and thereby disclosed example embodiments. The example embodiments were disclosed by verifying that the film of the example embodiments had a comparatively regular storage modulus over a wide temperature range to provide a comparatively regular elastic characteristic in various temperatures and environments, and thereby it was possible to provide a film having excellent optical properties and excellent mechanical properties in a low temperature to a high temperature.

Figure 1B:
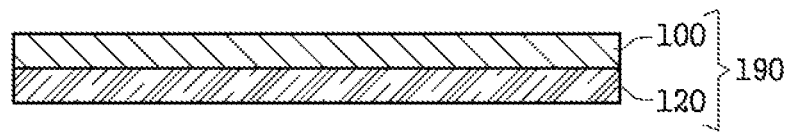
Figure 1C:
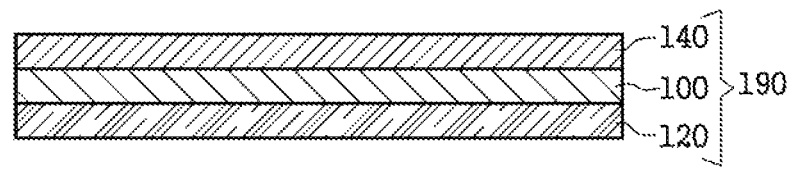
Figure 2A:
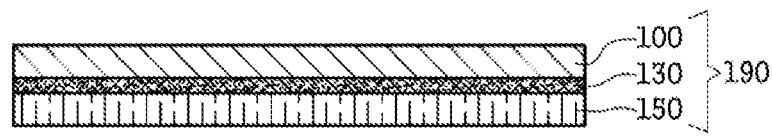
FIG. 2A, FIG. 2B and FIG. 2C show conceptual views of illustrating the film with sections, respectively, according to embodiments.
Figure 2B:
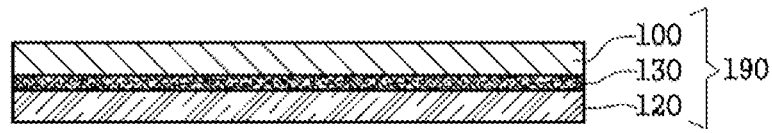
Figure 2C:
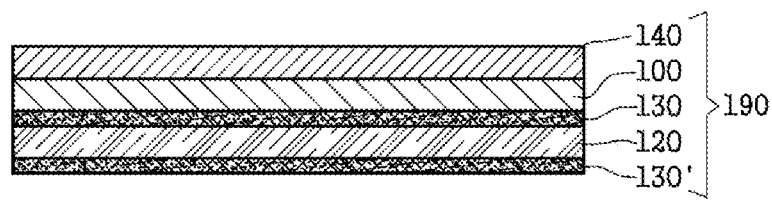
Figure 3:
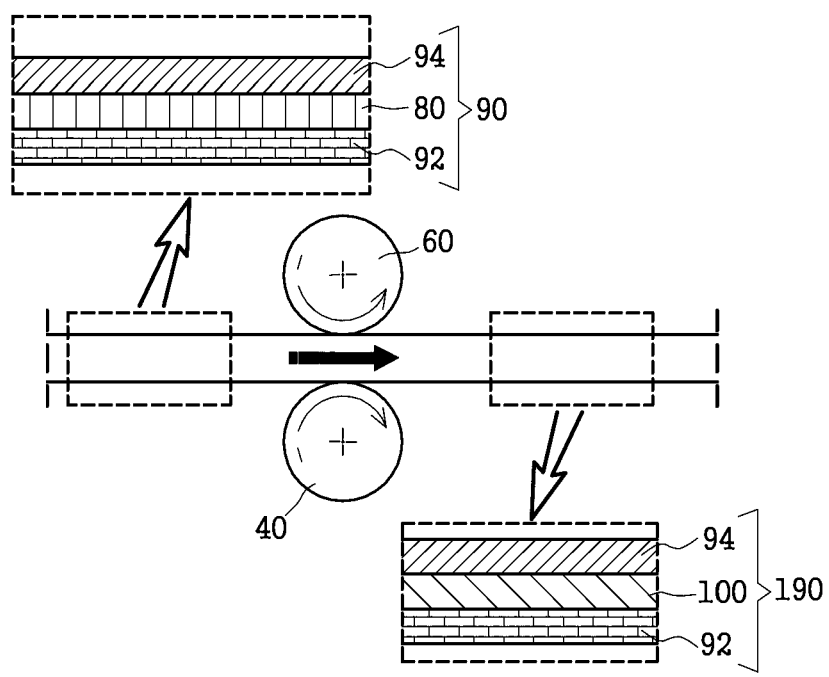
FIG. 3 is a conceptual view illustrating a method of manufacturing the film.

FIG. 1A, FIG. 1B and FIG. 1C are conceptual views illustrating the film with sections, respectively, according to embodiments. FIG. 2A, FIG. 2B and FIG. 2C are conceptual views illustrating the film with sections, respectively, according to embodiments. FIG. 3 is a conceptual view illustrating a manufacturing method of the film. Referring to FIG. 1A to FIG. 3, an elastic layer included in a film, the film, and a manufacturing method of the film is described.

In general aspect, the film 190 according to one embodiment comprises an elastic layer 100.

Elastic Layer 100

An Elastic Layer 100 has Excellent Mechanical Properties, and Particularly the Properties are Excellent in a Low Temperature.

A low temperature damage index (unit: MPa) is a difference of a tensile modulus (MPa) and a tensile strength (MPa) measured at a low temperature (a certain temperature of 0° C. or below).

An elastic layer 100 may have a low temperature damage index of 1,300 MPa or less, or 1,200 MPa or less at −40° C. An elastic layer 100 may have a low temperature damage index of 300 MPa or more at −40° C. The elastic layer having such a characteristic may have excellent mechanical properties even in a considerably low temperature and substantially can prevent the occurrence of a cracking phenomenon in a film.

An elastic layer 100 may have a low temperature damage index of 1,300 MPa or less, or 1,200 MPa or less at −10° C. An elastic layer 100 may have a low temperature damage index of 200 MPa or more at −40° C. The elastic layer having such a characteristic may have excellent mechanical properties even in a low temperature.

An elastic layer 100 may have a tensile modulus of 2,000 MPa or less, 1,500 MPa or less, or 1,000 MPa or less at −40° C. The elastic layer 100 may have a tensile modulus of 500 MPa or more at −40° C. An elastic layer 100 may have a tensile modulus of 3,000 MPa or less, 1,400 MPa or less, 1,200 MPa or less, 700 MPa or less, or 500 MPa or less at −10° C. The elastic layer 100 may have a tensile modulus of 350 MPa or more at −10° C.

When a tensile modulus of an elastic layer 100 is excessively high, a crack may be easily generated by performing of repetitive bending in a low temperature or external impact.

When a tensile modulus of an elastic layer 100 is the same as the above, even though repetitive bending is performed in a low temperature, occurrence of a cracking phenomenon or occurrence of damage by external impact can be remarkably decreased.

An elastic layer 100 may have a low temperature tensile modulus difference $TM_{-40-20}$ of 1000 MPa or less represented by below [Equation 2]. The low temperature tensile modulus difference $TM_{-40-20}$ refers to a difference obtained by subtracting a tensile modulus value at 20° C. from a tensile modulus value at −40° C.

$$TM_{-40-20}=TM_{-40}-TM_{20} \qquad \text{[Equation 2]}$$

In the Equation 2, $TM_{-40-20}$ is a low temperature tensile modulus, and $TM_n$ is a tensile modulus measured at n ° C.

The elastic layer 100 may have a $TM_{-40-20}$ value of 700 MPa or less, or 500 MPa or less, or 1 MPa or more.

When the elastic layer 100 has a $TM_{-40-20}$ value as the above, an elastic characteristic of the elastic layer can be substantially maintained well in a range of a low temperature to a room temperature, and particularly when the elastic layer is laminated with another layer together, it can substantially inhibit occurrence of a delamination phenomenon, a lift phenomenon, and the like even at a low temperature.

An elastic layer 100 may have an elongation of 200% or more at −40° C. An elastic layer 100 may have an elongation of 200% at −10° C. An elastic layer 100 may have an elongation of 200% at 20° C. In each temperature, the supremum of an elongation of the elastic layer is not detected, however it is thought as 400% or less.

When an elongation of an elastic layer 100 is the same as the above, the elastic layer can have excellent softness not only in a room temperature or an ambient temperature but also in a low temperature. The elastic layer may have excellent performing capacity for repetitive bending without occurrence of a cracking phenomenon not only in an ambient temperature but also in a low temperature.

An elastic layer 100 may have a tensile strength of 10 MPa or more, or 20 MPa or more at −40° C. An elastic layer 100 may have a tensile strength of 200 MPa or less, or 150 MPa or less at −40° C. An elastic layer 100 may have a tensile strength of 5 MPa or more, or 10 MPa or more at −10° C. An elastic layer 100 may have a tensile strength of 400 MPa or less, or 150 MPa or less at −10° C. An elastic layer 100 may have a tensile strength of 5 MPa or more, or 10 MPa or more at 20° C. An elastic layer 100 may have a tensile strength of 300 MPa or less, or 150 MPa or less at 20° C. The elastic layer 100 having such a characteristic may have a tensile strength of a certain level or above over a wide temperature range, and have mechanical properties of a proper level over a wide temperature range suitable for being applied to a cover film of a display.

An Elastic Layer 100 may have Excellent Optical Properties.

An elastic layer 100 may have a refractive index of 1.48 to 1.58, or 1.50 to 1.55. The elastic layer may have a refractive index of 1.505 to 1.53. Applying an elastic layer having such a refractive index is advantageous for embodying a display clearer when applied to a protective layer of a display.

An elastic layer 100 may have a haze of 3% or less, or 2% or less. An elastic layer may have a haze of 1.5% or less, or 1.2% or less. An elastic layer may have a haze of 0.01% or more, or 0.1% or more. When the elastic layer has the haze same as above, it is good for applying to a display area of a display device.

An elastic layer 100 may have a transmittance of visible light of 85% or more, 88% or more, or 90% or more. The elastic layer may have a transmittance of visible light of 99.99% or less. The elastic layer 100 or the film 190 comprising the same is advantageous for being applied to an electronic device as a protective layer (or a cover window).

An elastic layer 100 may have an in-plane retardation Re of 300 nm or less, 200 nm or less, or 100 nm or less. An elastic layer may have an in-plane retardation Re of 50 nm or less, or 45 nm or less. An elastic layer may have an in-plane retardation Re of 1 nm or more. The elastic layer having such an in-plane retardation characteristic can give an impact mitigation characteristic and a polarization characteristic at the same time to a film, when applied without a requirement for applying a separate polarizing layer or when applied with a polarizing layer.

An elastic layer 100 may have a thickness direction retardation Rth of 3,000 nm or less, 1,500 nm or less, or 1,000 nm or less. An elastic layer may have a thickness direction retardation Rth of 800 nm or less, 400 nm or less, or 300 nm or less. An elastic layer may have a thickness direction retardation Rth of 1 nm or more. An elastic layer having such a thickness direction retardation characteristic may give an impact mitigation characteristic and a polarization characteristic at the same time to a film, when applied without a requirement for applying a separate polarizing layer or applied with a polarizing layer.

An elastic layer 100 may be one in which a cloudy phenomenon is substantially not observed. Substantially the area in which a cloudy phenomenon is observed may be less than 1% of a total area of the elastic layer. In this time, the total area is based on a total film area applied to a product. The cloudy phenomenon may be objectified through haze measurement, and when the measured haze value is more than 1%, it can be considered as that cloudy phenomenon is observed. The degree of the cloudy phenomenon may be adjusted by controlling the degree of gelation of a resin applied to manufacture of an elastic layer, the molecular weight distribution, and the like.

An Elastic Layer 100 may have Excellent Characteristics Related to Storage Modulus.

An elastic layer 100 has a storage modulus index of 20 to 350 MPa indicated by Equation 1 below.

$$K_{SM} = \left(\frac{SM_{-40} \times SM_{80}}{SM_{20}}\right) - SM_{80} \qquad \text{[Equation 1]}$$

In the Equation 1, $K_{SM}$ is a storage modulus index of the elastic layer, and $SM_n$ is a storage modulus (Mpa) of the elastic layer measured at a temperature of n ° C.

For example, $SM_{-40}$ is the storage modulus (Mpa) of the elastic layer measured at −40° C., $SM_{20}$ is the storage modulus (Mpa) of the elastic layer measured at 20° C., and $SM_{80}$ is the storage modulus (Mpa) of the elastic layer measured at 80° C.

When the elastic layer has a storage modulus index in the values mentioned above, the elastic layer has a relatively stable storage modulus change in a comparatively wide temperature range, and so the elastic layer can have stable elastic qualities in a wide temperature range.

The elastic layer 100 may have a storage modulus of 3 GPa or less at a room temperature or an ambient temperature. The elastic layer may have a storage modulus of 2 GPa or less at a room temperature or an ambient temperature.

The elastic layer 100 has a characteristic that the storage modulus value is relatively low at a room temperature or an ambient temperature compared to PET film. In this feature, the elastic layer or the film including the same may thereby have more stable bending qualities and may further alleviate the impact transmitted from an external to the equipment placed on the other side of the elastic layer or the film.

The elastic layer 100 may have a high temperature storage modulus ratio $R_{80/20}$ of 0.08 or more. The high temperature storage modulus ratio $R_{80/20}$ is a ratio of storage modulus at 80° C. based on the storage modulus at 20° C. and is indicated by Equation 1-a below.

$$R_{80/20} = \frac{SM_{80}}{SM_{20}} \qquad \text{[Equation 1-a]}$$

In the Equation 1-a, $R_{80/20}$ is a high temperature storage modulus ratio, and $SM_n$ is a storage modulus (Mpa) of the elastic layer measured at a temperature of n ° C.

The elastic layer 100 may have a $R_{80/20}$ of 0.08 or more, 0.10 or more, or 0.15 or more. The elastic layer may have a $R_{80/20}$ of 0.20 or more, or 0.25 or more. The elastic layer may have a $R_{80/20}$ of 1 or less, or 0.85 or less. The elastic layer may have a $R_{80/20}$ of 0.7 or less, or 0.55 or less.

The elastic layer having $R_{80/20}$ in this range is advantageous for applying as bendable cover window to which successive bending is performed in a wide temperature range. These characteristics are more useful when the elastic layer is laminated with another layer. Specifically, applying the elastic layer having the above characteristics enables relatively easy control to degradation of material properties caused from the storage modulus difference depending on temperature between each layer. In addition, the elastic layer has excellent elastic qualities that are controllable even in a range of high temperature as well as at a room temperature or an ambient temperature.

The elastic layer 100 may have a $R_{80/20}$ of 0.15 to 0.55. The elastic layer may have a $R_{80/20}$ of 0.25 to 0.55. In this case, even after being bonded of the elastic layer and another component by using an adhesive layer and the like, it can have stable properties of the elastic layer. Simultaneously, it is possible to control the occurrence of a delamination phenomenon, a lifting phenomenon, or the like substantially at a high temperature as well as at an ambient temperature.

The elastic layer 100 may have a low temperature storage modulus ratio $R_{-40/20}$ of 1.15 or more. The low temperature storage modulus ratio $R_{-40/20}$ is a ratio of the storage modulus at −40° C. based on the storage modulus at 20° C. and is indicated by Equation 1-b below.

$$R_{-40/20} = \frac{SM_{-40}}{SM_{20}} \qquad \text{[Equation 1-b]}$$

In the equation 1-b, $R_{-40/20}$ is a low temperature storage modulus ratio, and $SM_n$ is a storage modulus (Mpa) of the elastic layer measured at a temperature of n° C.

The elastic layer 100 may have an $R_{-40/20}$ of 1.20 or more, or 1.33 or more. The elastic layer may have an $R_{-40/20}$ of 20 or less, or 10 or less. The elastic layer may have an $R_{-40/20}$ of 4.9 or less, or 4.5 or less.

The elastic layer having $R_{-40/20}$ in this range is advantageous for applying as bendable cover window to which successive bending is performed in a wide temperature range. These characteristics are more useful when the elastic layer is laminated with another layer. Specifically, applying the elastic layer having the above characteristics enables relatively easy control to degradation of material properties caused from the storage modulus difference depending on temperature between each layer. In addition, the elastic layer has excellent elastic qualities that are controllable even in a range of high temperature as well as at a room temperature or an ambient temperature.

The elastic layer 100 may have an $R_{-40/20}$ of 1.22 to 4.50. The elastic layer may have an $R_{-40/20}$ of 1.22 to 3.8. The elastic layer may have an $R_{-40/20}$ of 1.22 to 3.0. In this case, even after being bonded of the elastic layer and another component by using the adhesive layer and the like, it may have stable properties of the elastic layer. Simultaneously, it is possible to substantially control the occurrence of a delamination phenomenon, a lifting phenomenon, etc. at a low temperature as well as at an ambient temperature.

A low temperature storage modulus difference is a difference between a storage modulus at 20° C. and a storage modulus at −40° C. and is indicated by Equation 1-c below.

$$D_{-40-20} = SM_{-40} - SM_{20} \qquad \text{[Equation 1-c]}$$

In the Equation 1-c, $D_{-40-20}$ is a low temperature storage modulus difference, and $SM_n$ is a storage modulus (Mpa) of the elastic layer measured at a temperature of n° C.

The elastic layer 100 may have a $D_{-40-20}$ of −1500 MPa to 1500 MPa. The elastic layer may have a $D_{-40-20}$ of −1000 MPa to 1000 MPa. When the $D_{-40-20}$ of the elastic layer is more than 1500 MPa, because the difference in storage modulus at a room temperature and at a low temperature is relatively large, the elastic qualities may be substantially insufficient at a low temperature, and irreversible deformation such as cracks and tearing may occur due to deformation such as bending. Preferably, $D_{-40-20}$ of the elastic layer may be less than 1000 MPa.

The elastic layer 100 may have a storage modulus of 2300 MPa or less, or 2000 MPa or less at −40° C. The elastic layer may have a storage modulus of 200 MPa or more, 400 MPa or more, or 500 MPa or more at −40° C.

The elastic layer 100 may have a storage modulus of 2500 MPa or less, or 2000 MPa or less at 0° C. The elastic layer may have a storage modulus of 20 MPa or more, or 150 MPa or more at 0° C. The elastic layer may have a storage modulus of 180 to 1200 MPa at 0° C.

The elastic layer 100 may have a storage modulus of 10 Mpa or more, or 90 Mpa or more at 40° C. The elastic layer may have a storage modulus of 3000 MPa or less, or 2000 MPa or less at 40° C. The elastic layer may have a storage modulus of 100 to 1200 MPa at 40° C.

The elastic layer 100 may have a storage modulus of 4 MPa or more, or 20 MPa or more at 80° C. The elastic layer may have a storage modulus of 2000 MPa or less, or 1000 MPa or less at 80° C. The elastic layer may have a storage modulus of 40 to 950 MPa, or 60 to 350 MPa at 80° C.

The elastic layer 100 may have a difference of a storage modulus at 80° C. and a storage modulus at −40° C., and the difference of a storage modulus may range from −1000 to +1000 MPa. The difference is a value for convenience obtained by subtracting a small value from a large value and may be represented as absolute value, in this time, the difference may be 1000 MPa or less. The elastic layer having the above characteristics has a relatively small storage modulus difference in a wide temperature range from high temperature to low temperature, and thus can exhibit stable storage modulus characteristics in a wide temperature range.

The elastic layer 100 with the above-described storage modulus characteristics by each temperature has a suitable storage modulus value and/or a degree of change, at not only a room temperature or an ambient temperature but also in a wide temperature range from low temperature to high temperature.

The elastic layer 100 can adequately protect an equipment from external impact when applied to the equipment (multi-layered electronic device, etc.) by alone or with other layers due to its excellent recovery characteristic, which restore the original form even after repetitive transformations like bending or rolling.

An Elastic Layer 100 may have Excellent Recovery/Impact Resistance Characteristics.

The elastic layer 100 may have a recovery force index Rv greater than 50 indicated by Equation 3 below.

$$Rv = \left(\frac{X_{2\%} - Xf}{X_{2\%} - Xo}\right) \times 100 \qquad \text{[Equation 3]}$$

In the Equation 3,

Xo is a length (mm) of the initial elastic layer, $X_{2\%}$ is a length (mm) of the elastic layer after 2% length stretching, and Xf is a length (mm) of the elastic layer after 100 cycles when 1 cycle is defined as a process consisting of 2% length stretching at a rate of 50 mm/min and restoring to original length at a rate of 50 mm/min.

In the test of the recovery force index, fixing parts such as jigs for fixing an elastic layer are applied to both ends of the elastic layer. Because the length of the initial elastic layer and the length of the elastic layer after the cycle mean a length in which the tension has been repeated, Xo and Xf mentioned above are the length of elastic layer between the fixing portions, respectively.

The Rv of the elastic layer 100 may be 55 or more, 60 or more, or 68 or more. The Rv of the elastic layer may be less than 100, or may be 99 or less. The Rv of the elastic layer may be 95 or less, or 90 or less.

When Rv of an elastic layer 100 is in the range mentioned above, the elastic layer may have excellent recovery characteristic even after repeated stretching. In particular, even if the stretching-recovery is repeated in a relatively short length, like bending, the elastic layer has elastic recovery durability which can substantially maintain the properties and length of the initial elastic layer.

The Rv value of the elastic layer is based on a result of evaluating the elastic layer in the form of a film having a thickness of 100 µm by fixing it to a fixing part (eg, a jig) of the evaluation apparatus alone without applying a separate carrier film or supporting layer but is not limited thereto, and the measured value obtained by an evaluation recognized as equivalent can be also approved as Rv value.

The elastic layer 100 may have an impact strength of 2500 kJ/m² or more, an impact strength of 3500 kJ/m² or more, or an impact strength of 4500 kJ/m² or more. The elastic layer 100 may have an impact strength of 5000 kJ/m² or more, or an impact strength of 10000 kJ/m² or less. The elastic layer having these characteristics is useful for a cover film because it absorbs an impact from an external well and is not easily broken or damaged.

The elastic layer 100 may have an absorbed energy of 1.4 J or more, or an absorbed energy of 1.5 J or more. The elastic layer 100 may have an absorbed energy of 1.6 J or more, or an absorbed energy of 2.0 J or less. The elastic layer having these characteristics is useful for a cover film because it absorbs well an impact from an external and alleviates the impact being transmitted to an internal, so that protect the film itself to be not easily damaged.

The impact strength and the absorbed energy are based on the result from evaluation of tensile-impact strength in the elastic layer in accordance with JIS K 7160 standard, respectively, and specific measuring conditions are based on conditions presented in experiment example embodiment described below.

The elastic layer 100 may have an excellent durability as being evaluated by a dynamic folding test.

The dynamic folding test is performed in accordance with IEC 62715-6-1 standard. After dynamic folding test of 200 thousand times under the condition of the curvature radius of 2 mm and folding frequency of 2 sec/time at −40° C., whether a crack is generated in the elastic layer is checked.

The elastic layer 100 may have an excellent durability for not generating a crack substantially after dynamic folding test of 200 thousand times under the condition of the curvature radius of 2 mm and folding frequency of 2 sec/time at −40° C. in accordance with IEC 62715-6-1 standard.

The above means that the elastic layer has an excellent elasticity even when repetitive folding tests are performed over a wide temperature range, considering a characteristic of elasticity which becomes relatively lower at a low temperature than an elasticity at an ambient temperature or a high temperature.

An Elastic Layer 100 may have a Characteristic of Excellent Controlling for Thickness/Surface Roughness and the Like.

The elastic layer 100 may be in the form of a film in which the thickness is controlled to be substantially constant.

The elastic layer 100 may be in the form of an extruded film in which the thickness is controlled to be substantially constant.

The elastic layer may be laminated with other layers described below so that comprised in a laminated film.

In the above, the term "thickness is controlled to be (substantially) constant" means having a thickness adjusted to a range of −5% to +5% of the predetermined thickness.

The elastic layer 100 is in the form of a film and may have a thickness of less than 2000 µm. The elastic layer may have a thickness of 1500 µm or less, or 1000 µm or less. The elastic layer may have a thickness of 1 µm or more. The elastic layer may have a thickness of 20 µm to 300 µm or 50 µm to 300 µm.

The elastic layer 100 in the form of a film having the thickness as described above has the storage modulus characteristics described above and also has excellent optical properties, so that, it is suitable for use as a cover film of a display device.

The surface of elastic layer 100 has a low surface roughness of a predetermined level or less.

Surface roughness of the elastic layer may have a technical meaning by itself, but be related to other properties like optical properties thus affect material properties of the elastic layer such as optical properties. The inventors verified that the surface roughness of the elastic layer was able to affect to maintain the optical properties, in particular, a haze property of the film below a certain level.

A roughness reference value is a larger value between Ra1 and Ra2, and the Ra1 is a surface roughness Ra of one surface and Ra2 is a surface roughness Ra of the other surface.

The roughness reference value of the elastic layer 100 is 0.5 µm or less.

The roughness reference value of the elastic layer may be less than 0.5 µm, 0.2 µm or less, or 0.1 µm or less. The roughness reference value of the elastic layer may be greater than 0 µm, 0.0001 µm or more, or 0.001 µm or more.

When the roughness reference value of the elastic layer is controlled to a certain level or less, the optical properties of the elastic layer, in particular, haze property may be further improved.

The roughness reference value of the elastic layer 100 may be 0.001 to 0.1 µm. The roughness reference value of the elastic layer may be 0.0015 to 0.05 µm. The elastic layer having such a roughness reference value has better optical properties such as haze, and also has excellent utility as an optical film.

For example, one surface of the elastic layer is a surface in contact with a carrier film 92 described later, and the other surface of the elastic layer may be a surface in contact with a separate sheet-protecting film or a roll-type device (eg, a squeezing roll) in a manufacturing process.

The Ra1 and Ra2 may be controlled by adjusting surface roughness of a carrier film and a roll-type device (or a sheet-protecting film) in contact with one side or the other side of the elastic sheet, respectively, in manufacturing process of the elastic layer.

For example, if the surface roughness Ra of a carrier film is in a range of 0.8 to 1.2 µm, Ra1, which is a surface roughness Ra of one surface of an elastic layer, may be 0.8 to 1.2 µm.

For example, if the surface roughness Ra of a roll-type device is in a range of 0.01 to 0.5 µm, Ra2, which is a surface roughness Ra of the other surface of an elastic layer, may be in a range of 0.01 to 0.5 µm.

For example, if the surface roughness Ra of the sheet-protecting film is in a range of 0.01 to 0.5 µm, Ra2, which is a surface roughness Ra of the other surface of the elastic layer, may be in a range of 0.01 to 0.5 µm.

The carrier film 92 may be a polyethylene terephthalate (PET) film, but is not limited thereto.

The sheet-protecting film 94 may be a polyethylene (PE) film, but is not limited thereto.

The elastic layer 100 may have a shore D hardness of 20 to 75, or 30 to 70. It presents suitable hardness for applying as a cover film, and gives the film excellent impact resistance with elastic qualities.

The elastic layer 100 may have an inherent viscosity of 0.8 to 2.5 when measured at 25° C. with meta cresols in accordance with ISO 307:2019.

The elastic layer 100 may have a yellow index (Y.I) of 1 or less. The Y.I may be a value measured in YI E313 (D65/10) mode by applying a color meter ultra scanpro manufactured by Hunterlab.

The elastic layer 100 may have a value of 2 or less obtained by subtracting the Y.I measured before exposure, from the Y.I measured after being exposed to ultraviolet of 280 to 360 nm at a power of 3.0 W for 72 hours. The elastic layer may have a value of 1 or less obtained by subtracting the Y.I measured before exposure, from the Y.I measured after being exposed to ultraviolet of 280 to 360 nm at a power of 3.0 W for 72 hours. The elastic layer may have a value of 0.1 or more obtained by subtracting the Y.I measured before exposure, from the Y.I measured after being exposed to ultraviolet of 280 to 360 nm at a power of 3.0 W for 72 hours. The elastic layer having such characteristics may have excellent ultraviolet durability with little or no yellowing of the coating layer even when exposed to ultraviolet.

An Elastic Layer 100 may have an Amide Residue as a Repeating Unit.

The elastic layer 100 may comprise a polymer resin comprising an amide residue as a repeating unit.

The elastic layer 100 may be a plastic film comprising a polymer resin which has an amide residue as a repeating unit.

The elastic layer 100 may be an elastomer film comprising a polymer resin which has an amide residue as a repeating unit.

The content of the amide residue may be 30 wt % or more, or 50 wt % or more, or 60 wt % or more based on the entire polymer resin included in the elastic layer. The content of the amide residue may be 80 wt % or less, or 70 wt % or less based on the entire polymer resin included in the elastic layer. When the polymer resin having such characteristics is applied to the elastic layer, it may provide an elastic layer having better mechanical properties.

The content of the amide residue may be 92 to 97 mol % based on the entire polymer included in the elastic layer. When this polymer is applied to the elastic layer, it may provide an elastic layer having excellent strength and elastic qualities in a substantially wide range.

The elastic layer 100 comprises a polymer, and the polymer may comprise a rigid region and a soft region in the polymer chain.

The rigid region may be represented by a rigid segment or a semi-crystalline region. The soft region may be represented by a soft segment or an amorphous region.

The polymer comprises a rigid region and a soft region at the same time, and may enable the elastic layer to have a relatively strong mechanical strength and to have flexible and/or elastomeric properties, simultaneously.

The elastic layer may have a polymer chain region (homogeneous region) which includes monomers classified as the substantially same type. If degree of partial bonding or chain alignment of the polymer chain region (homogeneous region) is adjusted, the elastic layer can have both strength and elastic qualities that are intended. In the elastic layer, monomers classified as the substantially different type may be further bonded to the polymer chain region (homogeneous region). The elastic layer may have both a rigid region that is partially strong and a soft region that has partially soft properties so can give the polymer flexible qualities.

The elastic layer may comprise an elastic polyamide (long chain polyamide).

The elastic polyamide may comprise an amorphous region, which is a soft region, and may include a crystalline region, which is a rigid region. The amorphous region may be matrix, and the crystalline region may be distributed in the matrix.

The rigid region may comprise relatively more molecules with hydrogen-bonded C=O as compared to the soft region. The soft region may comprise more molecules with free C=O bonds that are not hydrogen-bonded as compared to the rigid region. The content of molecules with hydrogen-bonded C=O comprised in the rigid region and the soft region can be confirmed by measuring FT-IR spectra.

An elastic polyamide may comprise a semicrystalline polyamide. The elastic polyamide may comprise an amorphous polyamide. The elastic polyamide may comprise a mixture of semicrystalline polyamides and amorphous polyamides. It is preferable to comprise more than 50 wt % semicrystalline polyamide based on the entire elastic polyamide for the elastic polyamide.

The elastic polyamide may be a homo polyamide, polyamide copolymer, or a mixture thereof. The elastic polyamide may be prepared into homo polyamide by polymerizing one kind of monomer selected from amino acids, lactams or mixtures of diacids and diamines. The elastic polyamide may be prepared into polyamide copolymers by polymerizing two or more monomers selected from amino acids, lactams or mixtures of diacids and diamines.

The elastic polyamide may be prepared by combining a molecule containing an amide group at one end and another molecule containing a carboxyl group located at one end.

Examples of the monomer applied to prepare the elastic polyamide are as follows but are not limited thereto.

The aliphatic diacid may be, for example, adipic acid (6), azelaic acid (9), sebacic acid (10), dodecanedioic acid (12), and the like, but is not limited thereto.

The aromatic diacid may be, for example, terephthalic acid (T), isophthalic acid (I), and the like, but is not limited thereto.

The aliphatic diamine may be, for example, butylenediamine (4), hexamethylene-diamine (6 or HMDA), isomers of trimethylhexamethylenediamine (TMHMDA), octamethylenediamine (8), decamethylenediamine (10), dodecamethylenediamine (12) and the like, but is not limited thereto.

The aromatic diamine may be, for example, meta-xylenediamine (MXD), and the like, but is not limited thereto.

The cycloaliphatic diamine may be, for example, bis(3, 5-dialkyl-4-aminocyclohexyl)methane, bis(3,5-dialkyl-4-aminocyclohexyl)ethane, bis(3,5-dialkyl-4-aminocyclohexyl)propane, bis(3,5-dialkyl-4-aminocyclohexyl)butane, bis(3-methyl-4-aminocyclohexyl)methane (BMACM, MACM or B), bis(p-aminocyclohexyl)methane (PACM), isopropylidenedi(cyclohexylamine) (PACP), isophoronediamine (IPD), 2,6-bis(aminomethyl)norbornane (BAMN), piperazine, or a mixture thereof, but is not limited thereto, Other diamines may be, for example, isophoronediamine (IPDA), 2,6-bis-(aminomethyl)norbornane (BAMN), and the like, but are not limited thereto.

The lactam may be, for example, caprolactam (L6), lauryllactam (L12), and the like, but is not limited thereto.

The amino acid may be, for example, 11-aminoundecanoic acid (11), 11-(N-heptyl-amino)undecanoic acid (NHAU), and the like, but It is not limited thereto.

The elastic polyamide may comprise aliphatic polyamide. The elastic polyamide may consist of aliphatic polyamide.

The elastic polyamide may comprise a semi-aromatic polyamide. The elastic polyamide may consist of semi-aromatic polyamide.

The aliphatic polyamide may be, for example, polycaprolactam (PA 6), polyundecanamide (PA 11), polylauryllactam (PA 12), polybutylene adipamide (PA 46), polyhexamethylene adipamide (PA 66), polyhexamethylene azelamide (PA 69), polyhexamethylene sebacamide (PA 610), polyhexamethylene dodecanediamide (PA 612), polydecamethylene dodecanediamide (PA 1012), polydecamethylene sebacamide (PA 1010), polydodecamethylene dodecanediamide (PA 1212), PA 11/NHUA, PA BACM6, PA BACM10, PA BACM12, PA 6/66, PA 6/12 as polyamide copolymers, or mixtures thereof, but is not limited thereto. According to an embodiment, the polyamide copolymer may be PA 6/66, PA 6/610, PA6/12, or mixtures thereof.

The semi-aromatic polyamide may be, for example, PA 6/6T, PA 66/6T, PA 6T/6I, PA 66/6T/6I, PA 11/6T, PA 12/6T, PA MXD6, PA MXD10, or mixtures thereof, but is not limited thereto.

The amorphous polyamide may be, for example, polyhexamethylene isophthalamide (PA 6I), polytrimethylhexamethylene terephtalamide (PA TMHMDAT), PA BACM12 as polyamides; PA 6/BMACPI, PA 6/BAMNT, PA 11/BMACMI, PA 11/BMACMT/BMACMI, PA 11/BACM.I/IPDA.I, PA 12/BMACM.I, PA 12/BACMT/BACMI, PA 12/BMACMT/BACMI, PA 12/BACMI/IPDAI, PA 6T/6I/BACMI, PA 6T/6I/BACMT/BACMI as amide copolymers; or mixtures thereof, but is not limited thereto.

Preferably, the polyamide is a semicrystalline polyamide. In the present specification, semicrystalline polyamide may substantially mean a linear aliphatic polyamide. Preferably, the semicrystalline polyamide may be one selected from PA 6, PA 11, PA 12, PA 10.10, PA 10.12, PA 6.10, PA 6.12, and a combination thereof.

The elastic polyamide may be, for example, Rilsan®, Rilsamid®, etc. manufactured by Arkema France, but is not limited thereto.

The elastic layer 100 may comprise a polyether block amide (PEBA). The polyether block amide comprises two phases: a polyamide region that is a rigid region and a polyether region that is a soft region. The polyamide region may have a melting point of about 80° C. or more, specifically about 130 to 180° C., thus may substantially compose a rigid region as a crystalline phase. The polyether region may have a glass transition temperature of about −40° C. or less, specifically in the low temperature range of −80 to −40° C., thus may substantially compose an amorphous soft region.

The polyether block amide may be the combined one of a polyamide and an ether, in which the polyamide contains two or more carboxyl groups in a molecule and the ether contains two or more hydroxyl group in a molecule.

The elastic layer 100 may comprise a polyether block amide, and the polyether block amide may comprise one or more copolymer comprising a polyether block and a polyamide block. The polyether block amide comprises one or more polyether block and one or more polyamide block.

The copolymer (polyether block amide) comprising a polyether block and a polyamide block may be prepared by condensation polymerization of the polyether block comprising a reactive end and the polyamide block comprising a reactive end.

The polyether block amide may be a condensation polymer comprising a polyamide block and a polyalkylene block, wherein the polyamide block may comprise a diamine end, and the polyalkylene block may comprise a dicarboxylic end.

The polyether block amide may be a condensation polymer comprising a polyamide block and a polyether block, wherein the polyamide block may comprise a dicarboxyl end and the polyoxyalkylene block may comprise a diamine end. The polyoxyalkylene block may be obtained by cyanoethylation and hydrogenation of an aliphatic α, ω-dihydroxylated polyoxyalkylene block known as polyetherdiol.

The polyether block amide may be a condensation polymer comprising a polyamide block with a dicarboxyl end and a polyetherdiol block. In this case, the polyether block amide is polyetheresteramide.

For example, a polyamide block comprising dicarboxyl chain ends may comprise a condensation polymer of polyamide precursors in the presence of chain limiting dicarboxylic acids. For example, a polyamide block comprising diamine chain ends may be a condensation polymer of polyamide precursors in the presence of chain limiting diamines.

For example, a polyamide block comprising a dicarboxylic chain end may comprise a condensation polymer of α, ω-aminocarboxylic acid, lactam or dicarboxylic acid with diamine in the presence of chain limiting dicarboxylic acid. The polyamide block may be advantageously polyamide 12 or polyamide 6.

The polyether block amide may comprise a block having structure of randomly distributed units.

Advantageously, three types of polyamide blocks may be used.

As a first type, the polyamide block may comprise a condensation polymer of a carboxylic acid and an aliphatic or arylaliphatic diamine. The carboxyl acid may have 4 to 20 carbon atoms, and preferably 6 to 18 carbon atoms. The aliphatic or arylaliphatic diamine may have 2 to 20 carbon atoms, and preferably 6 to 14 carbon atoms.

The dicarboxylic acid may be, for example, 1,4-cyclohexanedicarboxylic acid, 1,2-cyclohexyldicarboxylic acid, 1,4-butanedioic acid, adipic acid, azelaic acid, suberic acid, sebacic acid, 1,12-dodecanedicarboxylic acid, 1,14-tetradecanedicarboxylic acid, 1,18-octadecanedicarboxylic acid, terephthalic acid, isophthalic acid, haphthalenedicarboxylic acid, dimerized fatty acid, and the like.

The diamines may be, for example, 1,5-tetramethylenediamine, 1,6-hexamethylenediamine, 1,10-decamethylenediamine, 1,12-dodecamethylenediamine, trimethyl-1,6-hexamethylenediamine, 2-methyl-1,5-pentamethylenediamine, the isomers of bis (3-methyl-4-aminocyclohexyl) methan (BMACM), 2,2-bis (3-methyl-4-aminocyclohexyl) propane (BMACP), bis (para-aminocyclohexyl) methane (PACM), isophoronediamine (IPD), 2,6-bis (aminomethyl) norbornane (BAMN), piperazine (Pip), meta-xylylenediamine (MXD), para-xylylenediamine (PXD), and the like.

Advantageously, a first type of the polyamide block may comprise PA 412, PA 414, PA 418, PA 610, PA 612, PA 614, PA 618, PA 912, PA 1010, PA 1012, PA 1014, PA 1018, MXD6, PXD6, MXD10, or PXD10.

A second type of the polyamide block in which dicarboxylic acid or diamine having 4 to 12 carbon atoms is contained, may comprise a condensation polymer of one or more α,ω-aminocarboxylic acid and/or one or more lactam having 6 to 12 carbon atoms.

The lactams may be, for example, caprolactam, oenantholactam, lauryllactam and the like.

The α, ω-aminocarboxylic acid may be, for example, aminocaproic acid, 7-aminoheptanoic acid, 11-aminoundecanoic acid, 12-aminododecanoic acid, and the like.

Advantageously, the second type of the polyamide block may comprise polyamide 11, polyamide 12 or polyamide 6.

A third type of the polyamide block may comprise a condensation polymer of one or more α, ω-aminocarboxylic acids (or one or more lactams), one or more diamines and one or more dicarboxylic acids.

In this case, the polyamide PA block may be prepared by condensation polymerization of a diamine, a diacid and a comonomer (or comonomers) as below.

The diamine may be, for example, a linear aliphatic diamine, an aromatic diamine, a diamine having X carbon atoms, and the like. The diacid may be, for example, dicarboxylic acid, an acid having Y carbon atoms, and the like. The comonomer or comonomers {Z} may be selected from the lactam and the w-aminocarboxylic acid having Z carbon atoms, and a substantially equimolar mixture comprising at least one diamine having X1 carbon atoms and at least one dicarboxylic acid having Y1 carbon atoms. However, the (X1, Y1) is different from (X, Y).

The comonomer or comonomers {Z} may be comprised with 50 wt % or less, preferably 20 wt % or less, advantageously 10 wt % or less, based on an entire combined polyamide precursor monomer.

The condensation reaction according to the third type may proceed in the presence of a chain limiting agent selected from dicarboxylic acids.

Advantageously, the dicarboxylic acid having Y carbon atoms may be used as chain limiting agent, and the dicarboxylic acid may be introduced in a stoichiometrically excessive amount compared to an amount of the one or more diamine.

As an alternative form of the third type, the polyamide block in which optionally the chain limiting agent is contained, may comprise two or more kinds of α, ω-aminocarboxylic acids having 6 to 12 carbon atoms, or two or more kinds of lactams having 6 to 12 carbon atoms, or a condensation polymer of a lactam and an aminocarboxylic acid each having different number of carbon atoms.

The aliphatic α, ω-aminocarboxylic acid may be, for example, aminocaproic acid, 7-aminoheptanoic acid, 11-aminoundecanoic acid, 12-aminododecane, and the like.

The lactams may be, for example, caprolactam, oenantholactam, lauryllactam and the like.

The aliphatic diamine may be, for example, hexamethylene diamine, dodecamethylene diamine, trimethylhexamethylene diamine, and the like.

The cycloaliphatic diacid may be, for example, 1,4-cyclohexanedicarboxylic acid.

The aliphatic diacid may be, for example, butanedioic acid, adipic acid, azelaic acid, suberic acid, sebacic acid, dodecanedicarboxylic acid, dimer fatty acids (preferably at least 98% or more dimer ratio; preferably hydrogenated; Available under the trade name Pripol from Uniqema or trade name Empol from Henkel), polyoxyalkylene-α, ω-diacid, and the like.

The aromatic diacid may be, for example, terephthalic acid (T) and isophthalic acid (I), and the like.

The cycloaliphatic diamine may be, for example, bis(3-methyl-4-aminocyclohexyl)methane (BMACM), isomers of 2,2-bis(3-methyl-4-aminocyclohexyl)propane (BMACP), and bis(para-Aminocyclohexyl)methane (PACM), and the like.

Other diamines may be, for example, isophoronediamine (IPD), 2,6-bis(aminomethyl)novonane (BAMN) and piperazine, and the like.

The aryl aliphatic diamine may be, for example, meta-xylylenediamine (MXD) and para-xylylene diamine (PXD), and the like.

Examples of the third type polyamide block may be, for example, PA 66/6, PA 66/610/11/12, and the like.

In the PA 66/6, 66 represents a hexamethylenediamine unit condensed with adipic acid, and 6 represents a unit introduced by condensation of caprolactam.

In the PA 66/610/11/12, 66 represents a hexamethylenediamine unit condensed with adipic acid, 610 represents a hexamethylenediamine unit condensed with sebacic acid, 11 represents a unit introduced by condensation of aminoundecanoic acid, and 12 represents a unit introduced by condensation of lauryllactam.

The number average molar mass (Mn) of the polyamide block may be 400 to 20000 g/mol, preferably 500 to 10000 g/mol.

For example, the polyether block (PE) is preferably selected from one or more polyalkylene ether polyols, in particular, polyethylene glycol (PEG), polypropylene glycol (PPG), polytrimethylene glycol (PO3G), polytetramethylene glycol (PTMG), mixtures thereof or copolymers thereof, as polyalkylene ether diols. The polyether block may contain a polyoxyalkylene sequence comprising $NH_2$ chain end and the sequence may be introduced by cyanoacetylation of an aliphatic α, ω-dihydroxy polyoxyalkylene sequence known as polyetherdiol. Specifically, Jeffamine (eg, Jeffamine® D400, D2000, ED2003 or XTJ542 manufactured by Huntsman) may be used.

The at least one polyether block preferably includes, for example, a polyalkylene ether polyol such as PEG, PPG, PO3G, PTMG, a polyether comprising NH2 at the chain end with comprising a polyoxyalkylene sequence, copolymers in which they are randomly arranged and/or block arranged (ether copolymers), and at least one polyether selected from mixtures thereof.

The polyether block may be included 10 to 80 wt %, preferably 20 to 60 wt %, preferably 20 to 40 wt %, based on the total weight of the copolymer.

The number average molecular weight of the polyether block may be 200 to 1000 g/mol (excluding limits), preferably 400 to 800 g/mol (including limits), preferably 500 to 700 g/mol.

The polyether block may be introduced from polyethylene glycol. The polyether block may be introduced from polypropylene glycol. The polyether block may be produced from polytetramethylene glycol. The polyether block may be copolymerized with polyamide blocks comprising carboxyl ends to form polyether block amides. The polyether block may be aminated to be converted to polyetherdiamine, and then condensed with a polyamide block including carboxyl end to form a polyether block amide. The polyether block may be mixed with polyamide precursors and chain limiting agent to form polyether block amides having statistically distributed units.

The polyether comprises, for example, polyethylene glycol (PEG), polypropylene glycol (PPG) or polytetramethylene glycol (PTMG), and the like. The polytetramethylene glycol is also known as polytetrahydrofuran (PTHF). Whether polyether block may be introduced into the chain of polyether block amides in the form of diols or diamines, for simplicity the polyether blocks are referred to as PEG blocks, PPG blocks or PTMG blocks, respectively.

Even if the polyether block comprises units other than units derived from ethylene glycol ($—OC_2H_4—$), propylene glycol ($—O—CH_2—CH(CH_3)—$), or tetramethylene glycol ($—O—(CH_2)_4—$), the polyether block does not depart from the scope of the present embodiments.

The number average molar mass of the polyamide block may be advantageously 300 to 15,000, preferably 600 to 5000. The number average molar mass of the polyether block may be 100 to 6000, preferably 200 to 3000.

Advantageously, the content of polyamide contained in the polyether block amide may be at least 30 wt % or more, or at least 50 wt % or more based on the total polyether block amide. This may also mean a possibility of statistical distribution in the polymer chain. The content of the polyamide is preferably 30 to 80 wt %, or 50 to 80 wt %. The content of the polyether contained in the polyether block amide is preferably 20 to 70 wt %, or 20 to 50 wt % based on the total polyether block amide.

Preferably, the polyamide block and the polyether block in the copolymer may have a number average molar mass ratio of 1:0.25 to 1, and the number average molar mass of polyamide block and the polyether block in the copolymer may be 1000/1000, 1300/650, 2000/1000, 2600/650 or 4000/1000, respectively.

The preparing method of polyether block amide may comprise a first operation of preparing a polyamide block and a polyether block, and a second operation of preparing an elastic polyether block amide by condensation polymerization of the prepared polyamide block and a polyether block. The polyether block amide may be prepared by condensation polymerization of monomers in a single operation.

The polyether block amide may have, for example, a Shore D hardness of 20 to 75, advantageously 30 to 70. The polyether block amide has an intrinsic viscosity of 0.8 to 2.5, as measured by meta-cresol at 25° C. The intrinsic viscosity is measured according to ISO 307: 2019. In detail, the intrinsic viscosity measurement in solution is measured in a 0.5 wt % meta-cresol solution relative to the total solution at 25° C. using a Ubbelohde viscometer.

The polyether block amides may be, for example, PEBAX®, Pebax® Rnew® manufactured by Arkema, and VESTAMID® E manufactured by Evonik, but are not limited thereto.

The elastic layer 100 may comprise a thermoplastic polyurethane (TPU), and a copolymer of a polyurethane block (PU) and a polyether block (PE), also called as polyetherurethane.

TPU may be a condensation polymer comprising soft PE blocks such as polyether diols or polyester diols (e.g., poly(butyladipate), polycarpolactonediol) and hard PU blocks. The PU block and the PE block may be connected by a combination derived from the reaction of the isocyanate group of the polyether and the hydroxyl group of the polyetherdiol.

In the present specification, the polyurethane means a product prepared by the reaction of at least one diisocyanate selected from aromatic diisocyanates (eg MDI, TDI) and/or aliphatic diisocyanates (eg HDI or hexamethylenediisocyanate) with at least one diol having short chain length (eg butanediol, ethylene glycol).

The elastic layer may comprise a polyetherester copolymer (COPE).

COPE may comprise at least one polyether block (PE) and at least one polyester block (homopolymer or ester copolymer).

COPE may comprise a flexible PE block derived from polyetherdiol, a rigid polyester block derived from reaction with at least one dicarboxylic acid and at least one short chain extender diol unit. The PES block and the PE block may be connected by an ester bond introduced by the reaction of the acid of dicarboxylic acid and the hydroxyl group of polyetherdiol. The short chain extender diol may be selected from the group consisting of neopentyl glycol and aliphatic glycols of the formula $HO(CH_2)_nOH$, wherein n is an integer from 2 to 10.

While polyether chains and diacid chains form flexible blocks, diacid chains and glycol or butanediol chains form hard polyetherester copolymer hard blocks. Advantageously, the diacid is an aromatic dicarboxylic acid having 8 to 14 carbon atoms. Aromatic dicarboxylic acid may be replaced with one or more other aromatic dicarboxylic acids having 8 to 14 carbon atoms within 50 mole % of the whole of the aromatic dicarboxylic acid. Aromatic dicarboxylic acid may be replaced with aliphatic dicarboxylic acid having 2 to 14 carbon atoms within 20 mol % of a total aromatic dicarboxylic acid.

The aromatic dicarboxylic acid may be, for example, terephthalic acid, isophthalic acid, bibenzoic acid, naphthalene dicarboxylic acid, 4,4-diphenylenedicarboxylic acid, bis(p-carboxyphenyl)methane acid, ethylene bis(p-benzoic acid), 1,4-tetramethylene bis(p-oxybenzoic acid), ethylene bis(p-oxybenzoic acid), 1,3-trimethylene bis(p-oxybenzoic acid), and the like.

Examples of glycols may be ethylene glycol, 1,3-trimethylene glycol, 1,4-tetramethylene glycol, 1,6-hexamethylene glycol, 1,3-propylene glycol, 1,8-octamethylene glycol, 1,10-decamethylene glycol, and the like.

COPE may include, for example, a polyether unit derived from polyetherdiol such as polyethylene glycol (PEG), polypropylene glycol (PPG), polytrimethylene glycol (PO3G) or polytetramethylene glycol (PTMG), and polyester units introduced by the reaction of an dicarboxyl acid (eg terephthalic acid) with a glycol (eg ethanediol, 1,4-butanediol). The polyetherester copolymers are described in patents EP402883 and EP405227 and the entire disclosure of which is incorporated herein by reference for all purposes.

The elastic layer may include the polyamide, the PEBA, the TPU, the COPE, or a mixture thereof.

The method of manufacturing an elastic layer using a polymer resin is mentioned later.

Film 190, Use of a Film 190

A film 190 according to another embodiment comprises an elastic layer 100.

A light transmitting laminate according to another embodiment comprises an elastic layer 100.

A cover film according to another embodiment comprises an elastic layer 100.

Detailed description of the elastic layer 100 is the same as described above, and omitted to avoid duplication.

The Film 190 may Comprise a Laminate Further Comprising a Carrier Film 92 Disposed on the One Surface 100a of the Elastic Layer.

The carrier film 92 may be a film having a thickness of 50 μm, and when considering the various aspects such as chemical resistance and dimensional stability, a PET film may be applied.

The carrier film 92 may be, for example, applied with a PET film in a thickness of 50 to 250 μm.

The carrier film 92 may simultaneously function as a release film 150 described below.

One surface of the carrier film 92 may directly contact the elastic layer 100.

In the manufacturing process of the elastic layer 100, the surface roughness of one surface of the carrier film 92 may be transcribed to one surface of the elastic layer in contact with it.

Surface roughness Ra of one surface of the carrier film 92 may be 0.5 μm or less, or 0.2 μm or less. Surface roughness Ra of one surface of the carrier film 92 may be greater than 0 μm, may be 0.0001 μm or more, or may be 0.001 μm or more.

Surface roughness Ra of one surface of the carrier film 92 may be 0.001 to 0.1 μm. The carrier film having such roughness may provide an elastic layer having a lower haze value by controlling the surface roughness of the elastic layer.

The film 190 may comprise a film-laminate consisting of the elastic layer 100 and the carrier film 92. The carrier film may function as a release film.

The film 190 may comprise a laminate further comprising an elastic layer 100 and a sheet-protecting film 94 placed on the elastic layer.

The film 190 may further comprise a sheet-protecting film 94 placed on the other surface 100b of the flexible layer.

The sheet-protecting film 94 may, for example, be applied with a PE film or a PET film. The thickness of the sheet-protecting film 94 is not particularly limited.

One surface of the sheet-protecting film 94 may be in direct contact with the other surface 100b of the flexible layer. When the sheet-protecting film is applied in the manufacturing process of the flexible layer, the surface roughness of one surface of the sheet-protecting film can control the surface roughness of the other surface of the flexible layer.

Surface roughness Ra of one surface of the sheet-protecting film 94 may be 0.5 μm or less, or 0.2 μm or less. Surface roughness Ra of one surface of the sheet-protecting film 94 may be greater than 0 μm, 0.0001 μm or more, or 0.001 μm or more.

Surface roughness Ra of one surface of the sheet-protecting film may be 0.001 to 0.1 μm. The sheet-protecting film having such roughness may provide a flexible layer having a lower haze value by controlling the surface roughness of the flexible layer.

The film 190 may comprise a laminate consisting of a flexible layer 100 and a sheet-protecting film placed on the flexible layer.

The film 190 may comprise a laminate consisting of a carrier film 92, an elastic layer 100 placed on the carrier film, and a sheet-protecting film 94 placed on the elastic layer.

The laminate may be a light transmitting laminate. In the present specification, the light transmitting laminate refer to a laminate having a light transmittance of 85% or more by itself.

A Film 190 may Comprise a Hardness Layer 120 Disposed on an Elastic Layer 100.

An elastic layer 100 may be disposed on a hardness layer 120.

A film 190 may comprise an adhesive layer 130 disposed between a hardness layer 120 and an elastic layer 100. The detailed description of the adhesive layer 130 is described below.

The film 190 may not include an adhesive layer as a separated layer between the elastic layer 100 and the hardness layer 120. In this time, the elastic layer 100 may be attached on the hardness layer 120 by method of melt adhesion.

The hardness layer 120 is a layer having a surface hardness of H or above.

The hardness layer 120 may have a surface hardness of H or above, 3H or above, or 4H or above measured by a pencil hardness method.

The hardness layer 120 may be a polyimide film, a glass layer, or a laminate thereof.

The polyimide film may be a layer prepared from a polyamide-imide polymer. The layer manufactured thereby includes an imide repeating unit, thus it may correspond to a polyimide film in a broad meaning.

The polyamide-imide polymer comprises a polymer formed by polymerization of an aromatic diamine compound, an aromatic dianhydride compound and a dicarbonyl compound. Specifically, the polyamide-imide polymer may be obtained by polymerization of an aromatic diamine compound, an aromatic dianhydride compound, and a dicarbonyl compound in an organic solvent.

The aromatic diamine compound may comprise 2,2'-bis (trifluoromethyl)-4,4'-diaminobiphenyl (TFMB), 2,2-bis (4-(4-aminophenoxy) phenyl) hexafluoropropane (HFBAPP), 4,4'-diamino-2,2'-bis (trifluoromethyl) diphenyl ether (BTFDPE), 2,2-bis (4-(4-amino-2-trifluoromethyl) phenoxy) phenyl) hexafluoropropane (HFFAPP), or 3,5-diaminobenzotrifluoride (DATF).

Specifically, the aromatic diamine compound may be a compound represented by Formula 1-1 below.

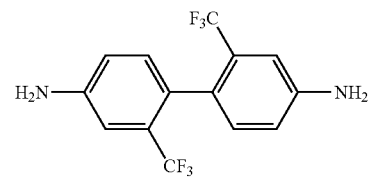

[Formula 1-1]

The aromatic dianhydride compound may comprise 2,2-bis (3,4-dicarboxyphenyl) hexafluoropropane dianhydride (6-FDA), 4,4'-oxydiphthalicanhydride (ODPA), or 2,3,3',4'-biphenyltetracarboxylic dianhydride (BPDA).

Specifically, the aromatic dianhydride compound may be a compound represented by Formula 2-1 below.

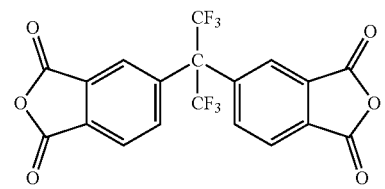

[Formula 2-1]

The aromatic diamine compound and the aromatic dianhydride compound may react in a mol ratio of 1:0.95 to 1.05 to form a polymer.

The dicarbonyl compound may be a compound represented by Formula 3-1 or Formula 3-2 below.

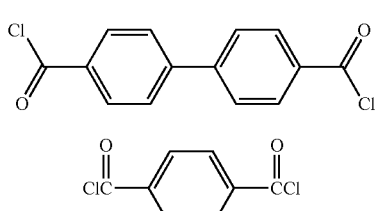

[Formula 3-1]

[Formula 3-2]

The aromatic diamine compound and the dicarbonyl compound may react in mol ratio of 1:0.95 to 1.05 to form a polymer.

The polyimide film may comprise at least one among the repeating units represented by Formula 4-1 to Formula 4-3 below.

[Formula 4-1]

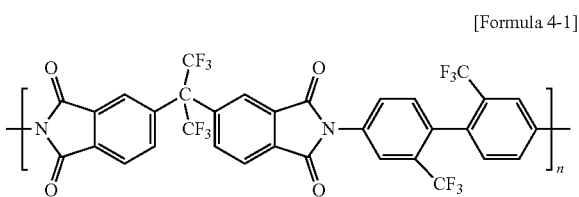

In the Formula 4-1, the n is an integer from 1 to 400.

[Formula 4-2]

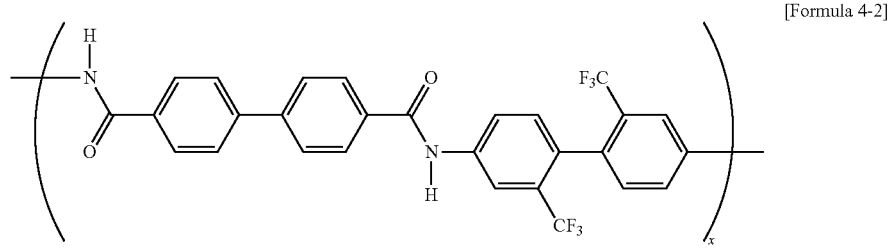

In the Formula 4-2, the x is an integer from 1 to 400.

[Formula 4-3]

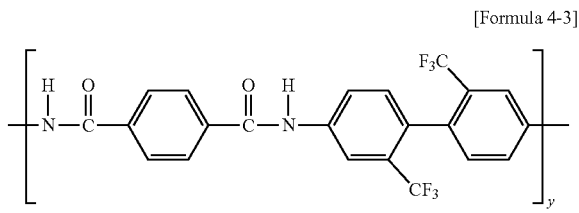

In the Formula 4-3, the y is an integer from 1 to 400.

The polyimide film may include an imide repeating unit and an amide repeating unit in a mol ratio of 1:1 to 4.

The polyimide film may have excellent transparence with the characteristics like excellent mechanical properties, chemical resistance, and heat resistance.

The polyimide film may have a modulus of 5.0 GPa or more, based on a thickness of 50 μm.

The polyimide film may have a yellow index of 5 or less, based on a thickness of 50 μm.

The polyimide film may have a haze of 2% or less, based on a thickness of 50 μm.

The polyimide film may be a transparent polyimide film.

The polyimide film may have a light transmittance of 85% or more measured at 550 nm, based on a thickness of 50 μm.

The polyimide film may have a stretching strength of 15 kgf/mm² or more, based on a thickness of 50 μm.

The polyimide film may have an elongation of 15% or more based on a thickness of 50 μm.

The polyimide film may further comprise a hard coating layer on the polyimide layer.

Any layer applied to a hard coating layer of the polyimide film may be applied as the hard coating layer without limitation.

As a glass layer, an ultra-thin glass (UTG) which has a heat resistance and an insulating characteristic and simultaneously whose curvature radius is small may be applied. The ultra-thin glass may be a product type for cover windows such as Dow Corning Corporation, Dowooinsys Corporation and SCHOTT Corporation, but not limited thereto. For example, the glass layer may have a thickness of 100 μm or less and may have a curvature radius of 2 mm or less.

The film 190 may further comprise an adhesive layer 130' disposed to be opposite to the elastic layer 100 having the hardness layer 120 placed therebetween. Description of the adhesive layer 130' is same as the above description of the adhesive layer 130, and thus detailed description will be omitted.

The film 190 may further comprise a release film 150 disposed to be opposite to the hardness layer 120 having the adhesive layer 130' placed therebetween. When the film further comprises a release film, the process of adhesion with other layers can be performed more easily. Description of the release film is the same as the above description, and thus will be omitted.

The film 190 may further comprise an adhesive layer 130 disposed on one surface or the other surface of the elastic layer, as required.

The adhesive layer 130 may be an optical adhesive layer excellent in light transmittance and/or transparency. For example, adhesive material comprising OCA (Optically Clear Adhesive), PSA (Pressure Sensitive Adhesive), or a mixture thereof may be applied.

The adhesive layer 130 may have a difference of a storage modulus at –40° C. and a storage modulus at 80° C., and the difference of the two storage moduluses may be from –100 to 100 kPa, or from –80 to 80 kPa. The adhesive layer 130 may have a value obtained by subtracting a storage modulus at 80° C. from a storage modulus at –40° C., and the value may range from 0.01 to 100 kPa, from 0.1 to 80 kPa, or from 1 to 50 kPa. When the adhesive layer 130 having these characteristics of storage modulus is applied to the film 10, recovery force and recovery durability of the film may be further enhanced, particularly it is useful for applying as a cover of flexible or rollable displays.

The elastic layer 100 may be disposed on the release film 150. The adhesive layer may be disposed between the elastic layer and the release layer. In this time, the film 190 may be a laminate which is laminated with a release film 150, an adhesive layer 130, and an elastic layer 100 in order.

The release film 150 may be, for example, a PET film, but is not limited thereto. In addition, the carrier film 92 or the sheet-protecting film 94 described above may be applied as release film 150.

Optical Properties of Layers Comprised in a Film 190

Not only an elastic layer comprised in a film 190, but also other layers excepting for the elastic layer may also excellent optical properties.

The elastic layer 100 may have a smaller refractive index than a refractive index of a hardness layer 120.

The elastic layer 100 may have a smaller refractive index than refractive index of adhesive layers 130, 130'.

The refractive index of the elastic layer 100 and the refractive index of the hardness layer 120 may have a difference of 0.2 or less, 0.1 or less, or 0.00001 or more.

The refractive index of the elastic layer 100 and the refractive index of the adhesive layers 130, 130' may have a difference of 0.2 or less, 0.1 or less, or 0.0001 or more.

The hardness layer 120 may have a refractive index of 1.55 to 1.75. The hardness layer 120 may have a refractive index of 1.55 to 1.70, 1.58 to 1.68, 1.60 to 1.68, 1.62 to 1.66 or 1.62 to 1.65.

The hardness layer may further comprise an additive such as a filler for an objective of adjusting a refractive index. For example, particles having an average diameter of 160 nm or less may be applied as the filler, and the particles may be barium sulfate particles.

The hardness layer 120 may have a haze of 1% or less. The hardness layer 120 may have a haze of 0.8% or less, 0.6% or less, or 0.5% or less.

The hardness layer 120 may have a light transmittance of 80% or more. For example, the hardness layer may have a light transmittance of 85% or more, 88% or more, 89% or more, 80% to 99%, 85% to 99%, or 88% to 99%.

The hardness layer 120 may have a yellow index of 5 or less. For example, the yellow index may be 4 or less, 3.5 or less, or 3 or less.

The hardness layer 120 may have a tensile strength of 14 kgf/mm$^2$ or more. In detail, the tensile strength of 16 kgf/mm$^2$ or more, 18 kgf/mm$^2$ or more, 20 kgf/mm$^2$ or more, 21 kgf/mm$^2$ or more, or 22 kgf/mm$^2$ or more.

A Film 190 may Further Comprise a Hard Coating Layer, a Polarizing Layer, a Sensor Layer, and the Like Disposed on or Under the Elastic Layer, Selectively.

The film may further comprise a hard coating layer 140 disposed on the elastic layer.

The hard coating layer 140 may be a hard coating layer applied to displays, and applicable without limitation if delamination does not occur in the folding/bending test and the like described below.

The film 190 may further comprise a polarizing layer 360.

The polarizing layer may be disposed under the one side 100a of the elastic layer. In this time, the film 190 may comprise a laminate which is laminated with a polarizing layer 360 and am elastic layer 100. In addition, the film 190 may comprise a laminate which is laminated with a polarizing layer 360, a hardness layer 120, and an elastic layer 100 in order. In this time, between a polarizing layer and an elastic layer, between a polarizing layer and a hardness layer, and/or between a hardness layer and an elastic layer, adhesive layer(s) 130, 130' may be disposed. In addition, when the adhesive layer is not disposed as a separated layer, the layers adjoined each other may be bonded by method of melt adhesion (hot-melt way).

The film 190 may further comprise a sensor layer 340.

The film may comprise a laminate in which a sensor layer 340 and an elastic layer 100 are laminated. Also, the film 190 may comprises a laminate in which a sensor layer 340, polarizing layer 360, and an elastic layer 100 are laminated in order. In this times, between a sensor layer and an elastic layer, between a sensor layer and a polarizing layer, between a sensor layer and a hardness layer, between a polarizing layer and a hardness layer and/or between a hardness and an elastic layer, respectively adhesive layer(s) 130, 130' may be disposed. In addition, when the adhesive layer(s) are not disposed, neighboring layers from each other may be bonded by a method of melt adhesion (hot-melt).

A Film 190 may Have Impact Resistance and the Like.

Delamination phenomenon may not occur at an interface laminated with an elastic layer 100 and another layer in the film 190, after dynamic folding test of 200 thousand times under the conditions of a radius of curvature of 2 mm and a folding frequency of 2 sec/time, in accordance with IEC 62715 standard, at −40° C. It means, considering the properties that elasticity in low temperature is relatively lower than elasticity in ambient temperature or high temperature, the elastic layer has excellent elastic qualities even in results of repetitive folding test in a wide temperature range.

The film 190 may have an impact strength of 2500 kJ/m$^2$ or more, an impact strength of 3500 kJ/m$^2$ or more, or an impact strength of 4500 kJ/m$^2$ or more. The film 190 may have an impact strength of 5000 kJ/m$^2$ or more, or an impact strength of 10000 kJ/m$^2$ or less. The film having these characteristics is useful for a cover film because it absorbs an impact from an external well and is not easily broken or impaired.

The film 190 may have an absorbed energy of 1.4 J or more, or an absorbed energy of 1.5 J or more. The film 190 may have an absorbed energy of 1.6 J or more, or an absorbed energy of 2.0 J or less. The film having these characteristics is useful for a cover film because it absorbs well an impact from an external and alleviates the impact being transmitted to an internal, so that protect the film itself to be not easily impaired.

The film 190 may have a difference in yellow indexes measured before and after irradiating ultraviolet rays for 72 hours in 3.0 W at UVB 280 to 360 nm, and the difference may be 2 or less, or less than 1. In addition, the yellow index difference of the film may be 0.8 or less, or 0.6 or less. The yellow index difference of the film may be 0.01 to 0.6, or 0.01 to 0.45. The film having these characteristics may not be yellow even after being exposed to strong ultraviolet and maintain excellent optical properties.

The film 190 may have a haze of 2% or less, or 1% or less. The film may have a haze of 0.8% or less, or 0.7% or less. The film may have a haze of 0.01% or more. The film 190 having these characteristics may have excellent optical properties and transparence.

A light transmitting laminate has the same characteristics of the film 190 described above. Detailed description of the light transmitting laminate is the same as the above and thus the further description will be omitted.

A cover film has the same characteristics of the film 190 described above.

Detailed description of the cover film is the same as the above and thus the further description will be omitted.

A Use of a Film 190 may be a Cover Window of a Multi-Layered Electronic Device.

The use of the film 190 may be a cover layer of display devices.

The cover layer means a layer forming an outward form at least in a part of the device, and functioning to protect interior equipment, not be limited to the one disposed on an outermost part of the device. In particular, when a cover layer is disposed on a display area of the device, it is called as a cover window.

The use of the film 190 may be a cover layer of bendable or foldable multi-layered electronic devices of which a part may be folded.

The use of film 190 may be a cover layer of rollable devices of which a part or all of a device may be rolled or unrolled reversibly.

The film 190 may be included in a protective film of displays.

When the film 190 is applied as a protective film of the displays, it has a suitable level of storage modulus value over a wide temperature range, so has stable bending or flexible qualities over a wide temperature range. Thereby impact transmitted to equipment, which is protected by the elastic layer, can be moderated in an alleviated level.

The film 190 may have excellent durability and recovery force even in repeated bending or flexible environments.

The film 190 may inhibit occurrence of delamination phenomenon in the layer directly in contact with the elastic layer, by applying the elastic layer 100 having a relatively stable storage modulus change in a wide temperature range. Delamination phenomenon may occur due to the difference in modulus between layers that are directly contacting the elastic layer, during repeated bending, folding, etc. The elastic layer has excellent optical properties so that it can be applied to a display and at the same time can control the storage modulus properties to suppress the occurrence of such a delamination phenomenon to a considerable level.

The film 190 may be disposed to outside the polarizing layer on the light source, and thus may protect the light emitting layer (320, display element).

The film 190 may be disposed on the light source, and thus may function as a polarizing layer simultaneously protecting a light emitting layer (320, display elements).

The film 190 may be disposed in a side of a light emitting functional layer 300, which comprise a light emitting layer 320 functioning as light emitting and/or a sensor layer 340 functioning as sensing like a touch sensor in a multi-layered electronic device 900. The film 190 has a use to protect the light emitting layer 300.

The film 190 may be disposed as a supporting layer of the light source and thus may have a use as a heat insulation supporting layer.

The use of the film 190 may be a supporting layer of a display device.

The supporting layer refers to a layer forming an outward form at least in a part of the device and functioning to support the light source device and the like. It is not limited to the one disposed on an outermost part of the device.

The use of the film 190 may be a supporting layer of a bendable or foldable multi-layered electronic device having some bended parts.

The use of the film 190 may be a supporting layer of a rollable device which can be reversibly rolled or unrolled in some parts or in the whole.

A light transmitting laminate has the same use of the film 190 described above.

A cover film has the same use of the film 190 described above.

Figure 4:
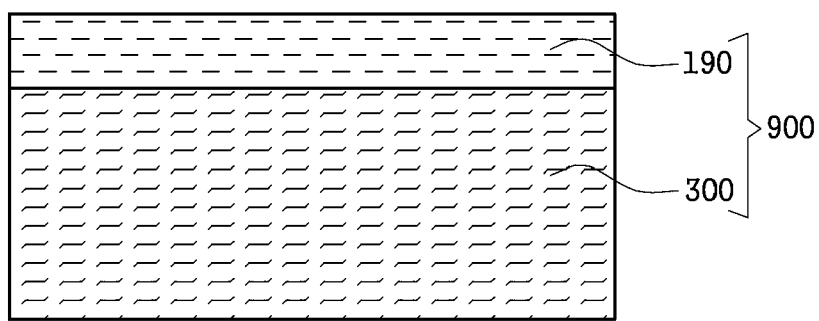
FIG. 4 is a conceptual view illustrating components of a multi-layered electronic device with a section, according to embodiments.
Figure 5A:
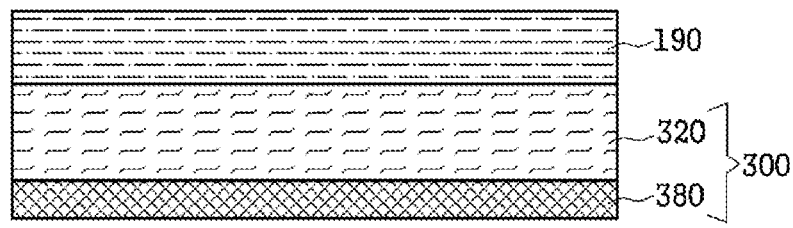
FIG. 5A, FIG. 5B and FIG. 5C shows conceptual views of illustrating compositions of multi-layered electronic devices with sections, respectively, according to embodiments.
Figure 5B:
Figure 5C:
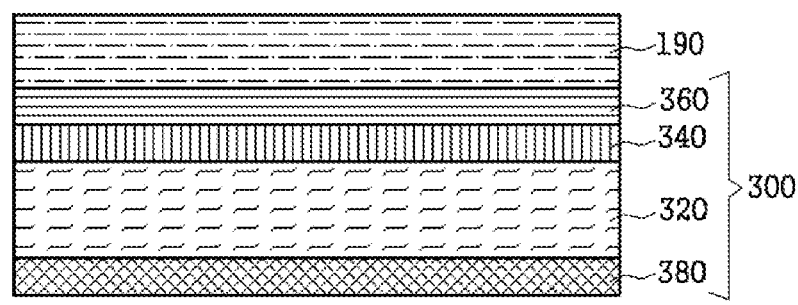
Figure 6:
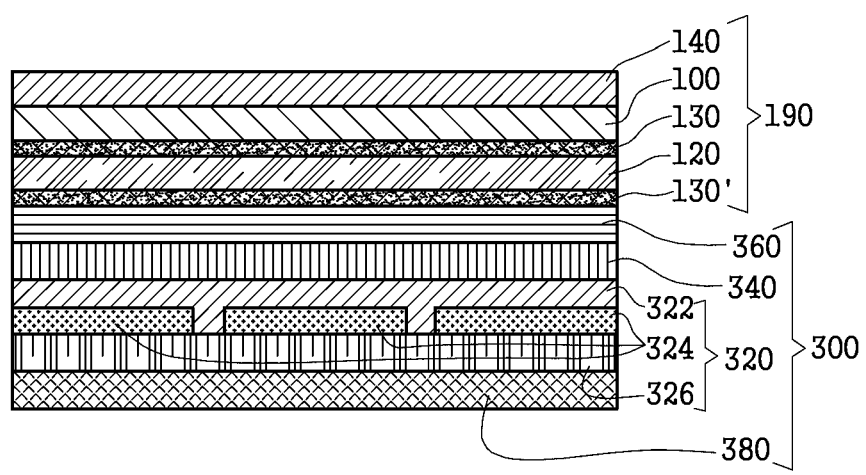
FIG. 6 is a conceptual view illustrating components of a multi-layered electronic device with a section, according to embodiments.

FIG. 4 is a conceptual view illustrating a composition of a multi-layered electronic device with a section, according to embodiments, FIG. 5A, FIG. 5B, and FIG. 5C are conceptual views illustrating a composition of a multi-layered electronic device with sections, respectively, according to embodiments, FIG. 6 is a conceptual view illustrating a composition of a multi-layered electronic device with a section, according to embodiments. Referring to FIG. 4 to FIG. 6, detailed description about a multi-layered device will be made.

Multi-Layered Electronic Device 900

In another embodiment, a multi-layered electronic device 900 comprises an elastic layer 100.

In another embodiment, a multi-layered electronic device 900 comprises a film 190.

In another embodiment, a multi-layered electronic device 900 comprises a light transmitting laminate.

The multi-layered electronic device 900 may be a display device, and for example, may be a large area display device, a foldable display device, a bendable display device, or a flexible display device. The multi-layered electronic device 900 may be a bendable mobile communication device such as mobile phone or a bendable laptop computer.

Further detailed information about the elastic layer 100 and the film 190 is omitted since it overlaps with the above description.

A multi-layered electronic device 900 according to one embodiment comprises a light emitting functional layer and a film, the light emitting functional layer has a display area for emitting of not emitting light depending on external signals, and the film may be disposed on an upper surface or a rear surface of the display area.

A multi-layered electronic device 900 according to one embodiment may comprise a light emitting functional layer and a film, the light emitting functional layer may have a display area for emitting of not emitting light depending on external signals, and the film may be disposed on one side of the light emitting functional layer and cover at least some of the display area.

The multi-layered electronic device 900 may comprise a film 190 placed on or under the light emitting functional layer 300.

The light emitting functional layer 300 comprises a light emitting layer 320.

The light emitting layer 320 comprises an element which emits light depending on a signal in a display device. The light emitting layer 320 may, for example, comprise a signal transmitting layer 322, the color-developing layer 324 and an encapsulation layer 326. The signal transmitting layer 322 transmits an electronic signal from an external to the color-developing layer. The color-developing layer 324 is disposed on the signal transmitting layer and develops color depending on a given signal. The encapsulation layer 326 protects the color-developing layer. The signal transmitting layer 322 may comprise a thin film transistor (TFT), and for example, LTPS, a-SiTFT, or Oxide TFT may be applied but not limited thereto. The encapsulation layer 326 may be TFE (Thin Film Encapsulation), but not limited thereto.

The light emitting layer 320 may be disposed on a supporting layer 380. The supporting layer 380 may be a layer having insulating qualities and heat resisting qualities, for example may be a polyimide film, a glass layer or so on. The film described above may be applied as the supporting layer.

The light emitting functional layer 300 may further comprise a sensor layer 340. The sensor layer 340 may be a touch sensor or so on.

The light emitting functional layer 300 may further comprise a polarizing layer 360. The polarizing layer 360 may be disposed on the light emitting layer 320, or on the sensor layer 340.

In the multi-layered electronic device 900, the elastic layer 100 or the film 190 may be bonded on the light emitting functional layer 300.

In the multi-layered electronic device 900, the elastic layer 100 or the film 190 may be applied as use of a cover film so may function as protecting the light emitting layer (320, display element) In addition, the elastic layer 100 or the film 190 has excellent optical properties, excellent elastic recovery force in a wide temperature range, and excellent durability so that it can suppress the occurrence of such a delamination phenomenon to a considerable level even in repetitive bending or folding processes, thereby it is useful for a window cover or a cover film.

Besides, the elastic layer 100 complements to protecting function (the function of protecting the interior of a cover film from external impact), which has been insufficient with a polyimide film applied as a hardness layer alone. The elastic layer 100 has rolling or bending durability which has been insufficient in conventional glass windows, and maintains protecting function with the same level as a conventional cover window applied with glass, so that it is useful for a cover layer, a protective film of the multi-layered electronic device.

Manufacturing Method of an Elastic Layer 100 or a Film 190

A manufacturing method of an elastic layer 100 according to embodiments comprises the operations of: forming an elastic sheet from a polymer resin; and passing the assembly in which the elastic sheet 80 is disposed on a carrier film 92, between rollers, thereby preparing an elastic layer 100.

The polymer resin may comprise an amide or a residue thereof as a repeating unit.

Detailed description about the repeating unit of the polymer resin, polymerization and so on is omitted since it overlaps with the above description about the elastic layer.

The manufacturing method of a film 190 according to embodiments comprises the operations of: forming an elastic sheet from a polymer resin; and passing the assembly in which the elastic sheet 80 is disposed on a carrier film 92, between rollers, thereby preparing an elastic layer 100.

When the film 190 comprises additional layers that are adhesive layers 130 and 130', a hardness layer 120, and/or a polarizing layer 360, the manufacturing method of the film 190 may further comprise the operations of laminating the elastic layer 100 and the additional layers.

The polymer resin may be an elastomer that forms an amide residue as a repeating unit. The polymer resin may be an elastic polyamide resin or may be a polyether block amide resin. The elastic polyamide resin may be PA11, PA12, PA1012, PA1010, PA610, PA612 and the like. The polyether block amide resin may be PEBAX®, Pebax®, Rnew® from ARKEMA FRANCE, VESTAMID® E from Evonik and the like.

The polymer resin may be formed with a sheet shape as an elastic sheet. The method of forming the elastic sheet may be applied if it is a method applied to the production of a film, a melt extrusion method may be applied. When the elastic layer or the film (or laminate) comprising the same are manufactured by the melt extrusion method, an elastic layer with excellent quality may be more efficiently produced.

When the polymer resin is melt-extruded and molded into a shape of an elastic sheet, the temperature of the melt extrusion may be 200 to 300° C. When a melt extrusion is performed in this temperature range, the polymer resin can be smoothly prepared into a sheet shape by adding fluidity to the polymer resin without impairing the properties of the resin itself.

The elastic sheet 80 may be disposed on the carrier film 92.

The sheet-laminate 90 comprising the carrier film and the elastic sheet disposed on the carrier film may be processed into an elastic layer 100 in the form of a film through a roller.

The roller may be applied as a first roll 40 and a second roll 60 having the sheet-laminate 90 therebetween, the first roll 40 may be a casting roll and the second roll may be a squeezing roll.

One surface of the sheet-laminate may be in contact with the casting roll, the other surface of the sheet-laminate may be in contact with the squeezing roll and processed to a certain thickness by pressing.

As needed in the processing, the sheet-laminate may further comprise a sheet-protecting film 94. Specifically, the sheet-laminate may comprise a carrier film 92, an elastic sheet (or elastic layer) disposed on the carrier film and a sheet-protecting film 94 disposed on the elastic sheet.

The manufacturing method of the elastic layer may provide an elastic layer controlled to have a predetermined thickness by preparing an elastic sheet having a constant thickness and passing it between rollers. The method of controlling the thickness of the elastic sheet and the method of controlling the thickness of the elastic layer by passing through the rollers is applicable if the method applied in the film production, and detailed description is omitted. In addition, since the detailed description of the thickness of the elastic layer is the same as described above, the description thereof is omitted.

Surface roughness of the elastic layer may be controlled in the process of passing between the rollers. Surface roughness of one surface of the elastic layer may be controlled by the roughness of the carrier film in direct contact with one surface of the elastic layer. The surface roughness of the other surface of the elastic layer may be controlled by the surface roughness of the squeezing roll in direct contact with the other surface of the elastic layer or the surface roughness of the sheet-protecting film. Since the surface roughness of one surface and the other surface of the elastic layer, the surface roughness of the carrier film, the surface roughness of the sheet-protecting film, the surface roughness of the squeezing roll and the like are same as described above, the description thereof is omitted.

In the method of manufacturing the film, the film may be manufactured in the form of an assembly with a carrier film and the like or the elastic layer itself from which the carrier film is removed.

The method of manufacturing the film may further comprise an operation of removing a carrier film from the assembly as needed.

The method of manufacturing the film may further comprise an operation of disposing an adhesive layer on one surface or the other surface of the elastic layer as needed.

The method of manufacturing the film may further comprise operations of disposing a hardness layer on one surface or the other surface of the elastic layer as needed. The hardness layer may be a polyimide layer or a glass layer.

The hardness layer may be attached via an adhesive layer disposed directly or separately from the elastic layer.

The method of manufacturing the film may further comprise a hard coating layer disposed on one surface or the other surface of the elastic layer. The process of forming the hard coating layer may be applied without limitation if it is a method of forming a hard coating layer on the display protective film.

The method of manufacturing the film may further comprise a polarizing plate disposed on one surface or the other surface of the elastic layer. Between the elastic layer and the polarizing plate, an adhesive layer may be disposed, a hardness layer may be disposed, or the adhesive layer and the hardness layer may be disposed together.

The detailed description of the film, the elastic layer, the use thereof, and the like are the same as described above, and thus description thereof is omitted.

Example embodiments will be explained in more detail with reference to the following examples. However, these examples are merely illustrative to assist in understanding example embodiments and are not intended to limit the scope of example embodiments.

Example: Manufacture of the Elastic Layer and Evaluation of Properties.

Preparation of Polymer Resin

Resin applied to the example or the comparative example of the film including an elastic layer was prepared as follows.

PEBA (polyether block amide) resin

Arkema Pebax® 2533 (PEBA Resin 1), Arkema Pebax® 5533 (PEBA Resin 2), Arkema Pebax® 7033 (PEBA Resin 3), Arkema Pebax® Rnew® 55R53 (PEBA Resin 4), Arkema Pebax® Rnew® 63R53 (PEBA Resin 5), Arkema Pebax® Rnew® 70R53 (PEBA Resin 6), Arkema Pebax® Rnew® 72R53 (PEBA Resin 7), Arkema Pebax® Rnew® 80R53 (PEBA Resin 8) and the like were obtained from Arkema France and applied to the following experiment.

PA (Polyamide) resin

PA610 (PA Resin 1), PA612 (PA Resin 2), PA1010 (PA Resin 3), PA1012 (PA Resin 4), PA12 (PA Resin 5), AESNO TL (PA Resin 6), PA11 (PA Resin 7), etc. were obtained from Arkema France and applied to the following experiment.

TPU film, PET film

The 46510 film (Aliphatic TPU) of Argotec was purchased and was applied to TPU. The NRF PET film by SKC Co., Ltd was applied to PET film.

Manufacture of Elastic Layer

After putting respective resins prepared in the above into an extruder to be processed by melt-kneading, the elastic sheet was extruded into a single layer sheet. At this time, the melt kneading temperature was applied to about 220° C. in the case of PEBA resin 7, and the process was performed by adjusting the melt kneading temperature in the range of about 200 to 300° C. according to each resin. The prepared monolayer elastic sheet was placed on a single carrier film (PET film with thickness of 50 μm to 250 μm. Ra of PET film is 0.001 to 0.01 μm) in a continuous process to form an assembly. While the assembly passes between the casting roll and the squeezing roll heated to a temperature of 10 to 120° C., and a laminate including the elastic layer was produced. Thereafter, the elastic layer having a thickness of about 100 μm from which the carrier film was removed was evaluated for properties below with the film of example. Respective films were disclosed by naming as the same as the above resins.

The film produced by the same method and thickness as above without applying a carrier film was evaluated for the properties below with the film of a comparative example.

Evaluation of Properties of the Elastic Layer

Evaluation of Low Temperature Damage Index and the Like

Tensile strength, elongation, and the like were measured by using a universal testing machine (UTM) with applying ASTM D882 standard and a moving speed of 50 mm/min. However, a chamber for adjusting a temperature was connected to the universal testing machine and thereby a temperature was adjusted to be measured. The measurement was performed at +20, −10, and −40° C., respectively. The measured tensile strength, elongation, tensile modulus, and the like were shown in below Table 1.

Evaluation of a low temperature damage index was performed with film samples of PEBA resin 5 and PEBA resin 6, and as comparative examples, a PET film and a TPU film prepared in the above were evaluated together.

TABLE 1

| Test Item | Temperature | Film Type | | | |
|---|---|---|---|---|---|
| | | PEBA Resin 5 | PEBA Resin 6 | PET Resin | TPU Resin |
| Tensile Strength (MPa) | −20° C. | 11.8 | 33.2 | 176.9 | 29.2 |
| | −10° C. | 22.8 | 41.5 | 195.4 | 51.6 |
| | −40° C. | 35.6 | 57.5 | 201.4 | 69.9 |
| Elongation (%) | −20° C. | more than 200 | more than 200 | 199 | more than 200 |
| | −10° C. | more than 200 | more than 200 | 174 | more than 200 |
| | −40° C. | more than 200 | more than 200 | 131 | 186 |
| Tensile Modulus (MPa) | −20° C. | 189 | 721 | 3425 | 182 |
| | −10° C. | 389 | 1188 | 4320 | 1417 |
| | −40° C. | 656 | 1202 | 4490 | 2233 |
| Low Temperature Damage Index (MPa)* | −10° C. | 366.2 | 1146.5 | 4124.6 | 1365.4 |
| | −40° C. | 620.4 | 1144.5 | 4288.6 | 2163.1 |
| $TM_{-40-20}$* (MPa) | | 467 | 481 | 1065 | 2051 |

*Low Temperature Damage Index (MPa) is a value obtained by subtracting a tensile strength (MPa) from a tensile modulus (MPa) measured at a low temperature (ex. a temperature of −10° C. or below).

*The low temperature tensile modulus difference $TM_{-40-20}$ is represented by Equation 2 below.

[Equation 2]

$TM_{-40-20} = TM_{-40} - TM_{20}$

In the Equation 2, $TM_{-40-20}$ is a low temperature tensile modulus, $TM_n$ is a tensile modulus measured at n° C.

Referring to the Table 1, PEBA film has excellent elongation over all temperature ranges, shows a low tensile modulus at a low temperature, and therefore the PEBA film is evaluated to have a low degree of crack occurrence compared to PET and TPU. Also, in a case of a low temperature damage index showing a difference of a tensile strength and a tensile modulus, the PEBA film shows values of 1300 MPa or less in both two temperatures of −10° C. and −40° C. and therefore it is thought to have a low degree of crack occurrence not only at a high temperature but also at a low temperature. In a case of PET film, it shows high values of above 4000 MPa in all temperatures and it is thought to generate a crack easily at a low temperature. In a case of TPU film, it is thought to be distinct from other examples in that the TPU film has a relatively high value at a low temperature.

Evaluation of Storage Modulus of the Elastic Layer

According to ASTM D4065, the storage modulus (E') was evaluated by applying a DMA Q800 model from TA instruments. Table 2 shows the results of measuring the storage modulus (E') in Mpa units at a temperature range (−40 to +80° C.) by applying 1 Hz and 2° C./min in DMA (Dynamic Mechanical Analysis) tension mode using the device. Amplitude of 5 μm was applied and Pre force of 0.01 N was applied.

Along with the above, the results of evaluating the storage modulus at a temperature by applying the PET film and the TPU film were presented. PET film is an NRF film with thickness of 50 μm manufactured by SKC Co., Ltd, and TPU is 46510 which is a monolayer film with thickness of 100 μm manufactured by Argotec.

All sample films were subjected to the above evaluation after conditioning in an atmosphere of 23° C. and 50% RH for 15 days.

TABLE 2

| E' (Mpa) | −40° C. | 0° C. | 20° C. | 40° C. | 80° C. |
|---|---|---|---|---|---|
| PA Resin 1 | 2211 | 1920 | 1692 | 914 | 327 |
| PA Resin 2 | 2109 | 1820 | 1605 | 921 | 306 |
| PA Resin 3 | 1652 | 1458 | 1324 | 832 | 249 |
| PA Resin 4 | 1510 | 1299 | 1163 | 751 | 193 |
| PA Resin 5 | 1365 | 1185 | 1120 | 1050 | 900 |
| PA Resin 6 | 1965 | 1762 | 1579 | 1067 | 274 |
| PA Resin 7 | 1567 | 1368 | 1260 | 949 | 220 |
| PEBA Resin 1 | 238 | 54 | 12 | 11 | 5 |
| PEBA Resin 2 | 656 | 214 | 149 | 119 | 73 |
| PEBA Resin 3 | 1370 | 843 | 487 | 300 | 170 |
| PEBA Resin 4 | 520 | 200 | 142 | 106 | 55 |
| PEBA Resin 5 | 1284 | 734 | 463 | 265 | 168 |
| PEBA Resin 6 | 1467 | 1087 | 781 | 406 | 210 |
| PEBA Resin 7 | 540 | 430 | 374 | 270 | 119 |
| PEBA Resin 8 | 600 | 480 | 432 | 360 | 130 |
| Other Resin 1 (PET) | 4450 | 4035 | 3889 | 3727 | 3084 |
| Other Resin 2 (TPU) | 2356 | 1250 | 480 | 88 | 3 |

| E' (Mpa) | R−40/20** | R80/20** | D−40−20*** | $K_{SM}$* | — |
|---|---|---|---|---|---|
| PA Resin 1 | 1.31 | 0.19 | 519 | 100.30 | — |
| PA Resin 2 | 1.31 | 0.19 | 504 | 96.09 | — |
| PA Resin 3 | 1.25 | 0.19 | 328 | 61.69 | — |
| PA Resin 4 | 1.30 | 0.17 | 347 | 57.58 | — |
| PA Resin 5 | 1.22 | 0.80 | 245 | 196.88 | — |
| PA Resin 6 | 1.24 | 0.17 | 386 | 66.98 | — |
| PA Resin 7 | 1.24 | 0.17 | 307 | 53.60 | — |
| PEBA Resin 1 | 19.83 | 0.42 | 226 | 94.17 | — |
| PEBA Resin 2 | 4.40 | 0.49 | 507 | 248.40 | — |
| PEBA Resin 3 | 2.81 | 0.35 | 883 | 308.23 | — |
| PEBA Resin 4 | 3.66 | 0.39 | 378 | 146.41 | — |
| PEBA Resin 5 | 2.77 | 0.36 | 821 | 297.90 | — |
| PEBA Resin 6 | 1.88 | 0.27 | 686 | 184.46 | — |
| PEBA Resin 7 | 1.44 | 0.32 | 166 | 52.82 | — |
| PEBA Resin 8 | 1.39 | 0.30 | 168 | 50.56 | — |
| Other Resin 1 (PET) | 1.14 | 0.79 | 561 | 444.88 | — |
| Other Resin 2 (TPU) | 4.91 | 0.01 | 1876 | 11.73 | — |

*Storage Modulus Index $K_{SM}$ is indicated by below Equation 1.
[Equation 1]

$$K_{SM} = \left(\frac{SM_{-40} \times SM_{80}}{SM_{20}}\right) - SM_{80}$$

**High Temperature Storage Modulus Ratio $R_{80/20}$ is indicated by below Equation 1-a.
[Equation 1-a]

$$R_{80/20} = \frac{SM_{80}}{SM_{20}}$$

**Low Temperature Storage Modulus Ratio $R_{-40/20}$ is indicated by below Equation 1-b.
[Equation 1-b]

$$R_{-40/20} = \frac{SM_{-40}}{SM_{20}}$$

**Low Temperature Storage Modulus Difference is indicated by below Equation 1-c.
[Equation 1-c]

$D_{-40-20} = SM_{-40} - SM_{20}$

In the above Equations, $SM_n$ is a storage modulus (MPa) measured at a temperature of n° C.

Evaluation of Surface Roughness, Yellow Index, Delta-Y.I, and the Like of the Elastic Layer Surface roughness was evaluated according to ASTM D4417 standard using SJ-310 model manufactured by Mitutoyo.

Haze was measured according to ISO 14782 standard using a haze meter NDH-7000N manufactured by Nippon Denshoku Co., Ltd. Light transmittance was also measured using the same device, and it was verified that all samples satisfied the condition of a light transmittance of 85% or more.

Y.I (Yellow Index) was measured in YI E313 (D65/10) mode by applying a color meter ultra scanpro manufactured by Hunterlab. When the measured value was 1 or less, it evaluated as Pass, when the measured value was more than 1, it evaluated as Fail.

Y.I of the film before and after exposure to ultraviolet at a power of 3.0 W for 72 hours was measured using a UVB Lamp (SANKYO DENKI G15T8E, wavelength 280~360 nm), then the value that subtract Y.I measured before exposure from Y.I measured after exposure is shown as Delta-Y.I.

TABLE 3

| | One Side Surface Roughness Ra, μm | The Other Side Surface Roughness Ra, μm | Haze (%) | Y.I | delta Y.I |
|---|---|---|---|---|---|
| PA Resin 7 | 0.0019 | 0.007 | 0.5 | Pass | 0.5 |
| PEBA Resin 2 | 0.0023 | 0.012 | 1 | Pass | 0.6 |
| PEBA Resin 4 | 0.0021 | 0.01 | 0.8 | Pass | 0.4 |
| PEBA Resin 7 | 0.002 | 0.008 | 0.6 | Pass | 0.4 |
| Other Resin 1(PET) | 0.0016 | 0.0018 | 0.4 | Pass | 1.0 |
| Other Resin 2(TPU) | 0.57 | 0.68 | 1.4 | Pass | 3.8 |
| Comparative Example | 0.01 to 1 | 0.1 to 2 | 50 to 90 | Pass | 0.5 |

Dynamic Folding Test for Evaluation of Recovery Force of the Elastic Layer

An 80 mm×25 mm film was fixed to 15 mm of end of the film by using a jig, and the length of the stressed film was set to 50 mm×25 mm. When 1 cycle was defined as a process consisting of 2% length stretching of the film at a rate of 50 mm/min and restoring to original length at a rate of 50 mm/min, after 100 cycles a tensile test was performed. The length (Xf) between the jig of the film after 100 cycles was measured, and the recovery index was evaluated by following formula 3 compared with the length (Xo, 50 mm) between the jig of an initial film.

$$Rv = \left(\frac{X_{2\%} - Xf}{X_{2\%} - Xo}\right) \times 100 \quad \text{[Equation 3]}$$

In the Equation 3,

Xo is the length of the initial elastic layer (mm), $X_{2\%}$ is the length of the elastic layer after 2% length stretching, Xf is the length (mm) of the elastic layer after 100 cycles when 1 cycle is defined as a process consisting of 2% length stretching at a rate of 50 mm/min and then restoring to original length at a rate of 50 mm/min.

Dynamic folding test was performed in accordance with IEC 62715-6-1 standard. The film was checked for cracks after dynamic folding test of 200 thousand times under the condition of the radius of curvature of 2 mm and the folding frequency of 2 sec/time at −40° C.

If crack occurs, it evaluated as Fail, if no crack occurs by visual observation, it evaluated as Pass.

TABLE 4

| | Recovery Index* | Dynamic Folding Test |
|---|---|---|
| PA Resin 7 | 60 | pass |
| PEBA Resin 2 | 88 | pass |
| PEBA Resin 4 | 82 | pass |
| PEBA Resin 7 | 75 | pass |
| Other Resin 1(PET) | 50 | fail |
| Other Resin 2(TPU) | 90 | fail |
| Comparative Example | 72 | pass |

Referring to Tables 2 to 4, the prepared elastic layers showed a low haze value compared to the elastic layer of the comparative example, which is considered to be related to the value of surface roughness.

In Delta-Y.I, examples using PA or PEBA showed better results compared to other resins. In particular, the results of the examples are excellent results compared to the other resin 1 of PET film, but also excellent results compared to the other resin 2 of TPU. In addition, considering that it is the result of applying the aliphatic TPU, which is known to have superior ultraviolet durability than the aromatic TPU, the films of the examples were evaluated to have excellent ultraviolet durability.

It was confirmed that the dynamic folding test conducted at −40° C. showed that both the other resin 1 and the other resin 2 were evaluated to Fail, and the film of the other resins has insufficient characteristics to be applied for bending or folding in a wide range of temperatures including low temperature.

In recovery index, although there were variations in the properties depending on the resin applied, the examples of PEBA film or PA film showed excellent results, also, PEBA film showed better results than the PA film.

In recovery index, the films of examples showed lower or equivalent properties than those of the other resin 2 to which the TPU film was applied. On the other hand, the results of ultraviolet durability (yellowing properties) and the dynamic folding test at low temperatures showed that the films of the examples are superior to the TPU film.

Considering these properties, it is considered that the elastic layer or the film including the same of the embodiment may have excellent utility in a foldable display in which bending or folding is repeated in a wide temperature range of low temperature to high temperature.

Measurement of Refractive Index and Retardation of the Elastic Layer

Refractive index was measured by using DR-A1-plus model manufactured by ATAGO at a temperature of 23° C. and a wavelength of 550 nm.

For measurement of in-plane-retardation and thickness direction retardation, the result measured by using RETS-100 manufactured by OTSKA ELECTRONICS at a wavelength of 550 nm was applied.

In a case of refractive index, it was tested by the same method as the above using separate samples prepared by applying polymer resins as below. Names of resins applied to manufacture of respective samples were shown in Table 5 together, and crystallinity degree was shown together in a case of PA resin.

In a case of in-plane retardation, samples prepared to have different thicknesses were separately prepared to be tested, and the result was shown in Table 6. A sample of comparative example was applied as the same as the above.

All the resins were applied by being provided from ARKEMA FRANCE.

TABLE 5

| Type (Crystallinity) | Resin Type | Refractive Index of a Film |
| --- | --- | --- |
| PEBA | PEBAX 5533 | 1.5036 |
|  | PEBAX 7233 | 1.5128 |
|  | PEBAX 55R53 | 1.5077 |
|  | PEBAX 72R53 | 1.5161 |
|  | PEBAX 80R53 | 1.5158 |
|  | PEBAX 30R51 | 1.49 |

TABLE 5-continued

| Type (Crystallinity) | Resin Type | Refractive Index of a Film |
| --- | --- | --- |
| PEBA (micro-crystalline) | PEBAX Clear 1200 | 1.517 |
| PA11 (crystalline) | Rilsan BESN | 1.518 |
| PA11 (amorphous) | Rilsan Clear G850 | 1.511 |
| PA12 (crystalline) | Rilsamid AESNO | 1.525 |

TABLE 6

|  | Thickness (μm) | Re (nm) | Rth (nm) |
| --- | --- | --- | --- |
| PEBA4 | 100 | 191.4 | 1558.5 |
| PEBA7 | 100 | 42.1 | 250.5 |
| PEBA7 | 50 | 20.4 | 212.7 |
| PET (NRF) | 40 | 427.1 | 6574 |

Referring to Table 5 and Table 6, a desired refractive index in a proper level can be obtained, and the retardation was verified as being a proper level to be utilized as an optical use.

Example: Manufacture of a Film and Evaluation of Properties.

Preparing a Film

Production of Specimens of a Cover Film: Commercial OCA manufactured by 3M Co., Ltd having thickness of 100 μm was used as an adhesive layer on a transparent polyimide film (manufactured by SKC Co., Ltd) having thickness of 50 μm. The OCA had a difference ranging −100 to +100 kPa between a storage modulus at −40 deg C. and a storage modulus at +80 deg C. The elastic layer manufactured above (the film manufactured using PEBA resin 7) was laminated on the adhesive layer, thereby producing a specimen of a cover film in Example 1 (structure of FIG. 2B).

Specimens of cover films were produced in the same manner as Example 1 but the kinds of the elastic layer is applied as Table 4 below, and designated as Example 2 and Comparative example 1, respectively.

Measurement of the Properties of the Film

1) Evaluation of Tensile-Impact Strength

Tensile-impact strength of the elastic layer was evaluated in accordance with JIS K 7160. Measuring temperature was 23 deg C., 0 50% R.H., and it was applied a pendulum of 4.0 J, a resonance angle of 150 deg when impact strength was measured. Absorbed energy was also measured, and the results were represented in Table 7 below.

2) Folding/Bending Test and Pen-Drop Test of the Film that is a Laminate

Dynamic Folding Test: Using specimens of a cover film in accordance with IEC 62715-6-1 standard, test of 200 thousand times was carried out under the condition of the radius of curvature of 2 mm and the folding frequency of 2sec/time. If delamination occurred, it was marked as X, and if delamination did not occur, it was marked as O. The result was represented in Table 8 below.

Static Bending Test: Using specimens of a cover film in accordance with IEC 62715-6-1 standard, test was carried out under the condition of the radius of curvature of 2 mm. After 24 hours if delamination occurred, it was marked as X, and if delamination did not occur, it was marked as O. The result was represented in Table 8 below.

Pen-drop Test: A ballpoint pen (BIC®) of about 5.4 g was dropped onto the laminated film sample at a height of 9 cm from the tip of its cap to the surface. If the state of the film surface was good, it was evaluated as Pass, and if cracks occurred on the film surface, it was evaluated as Fail. The result was represented in Table 8 below.

Light transmittance/Haze: Light transmittance and haze were evaluated by NDH7000 (manufactured by Nippon Denshoku Co., Ltd). It was evaluated as Pass if haze was 1% or less and evaluated as Fail if haze was greater than 1%. Transmittance was evaluated as Pass if transmittance in visible light was 90% or more, and evaluated as Fail if transmittance in visible light was less than 90%. The result was represented in Table 8 below.

TABLE 7

|  | Impact Strength (kJ/m²) | Absorbed energy (J) |
|---|---|---|
| Other Resin 1(PET) | 2900 | 1.43 |
| Other Resin 2(TPU) | 1900 | 1.05 |
| PEBA resin 7 | 5400 | 1.66 |

TABLE 8

|  |  | Example 1 | Example 2 | Comparative Example 1 | Comparative Example 2 |
|---|---|---|---|---|---|
| Structure of Film-laminate |  | PEBA resin 7 layer + Adhesive Layer + PI Film | TPU layer + Adhesive Layer + PI Film | PET layer + Adhesive Layer + PI Film | PI Film Alone |
| Dynamic | −40 deg C. | Pass | Fail | Fail | — |
| Folding Test | 80 deg C. | Pass | Pass | Fail | — |
| Static Bending | −40 deg C. | Pass | Pass | Fail | — |
| Test | 80 deg C. | Pass | Pass | Fail | — |
| Pen-drop Test | 9 cm | Pass | Pass | Pass | Fail |
| Light transmittance (%) |  | Pass | Pass | Pass | Pass |
| Haze (%) |  | Pass | Pass | Pass | Pass |

Referring to Table 7, the impact strength of an example film applied with PEBA resin 7 was significantly higher than the impact strength of the film applied with other resin 2 (TPU) or the impact strength of the film applied with other resin 1 (PET), so it is verified that the example film has properties that were very strong to impact. Absorbed energy was also significantly excellent in the example film applied with PEBA resin 7, rather than in the film applied with other resin 2 (TPU) or in the film applied with other resin 1 (PET).

It is shown that TPU is superior to PET in storage modulus related properties, but TPU is inferior to PET in tensile-impact strength. At the same time, the result in Table 3 show that the film applied with PEBA is superior in storage modulus properties and tensile-impact strength both.

Referring to Table 8, the laminate of Example 1 applied with PEBA resin 7 produced above was rated as the superior in all measured properties because it got Pass in all performed evaluations such as dynamic folding test in high and low temperature, static bending test in high and low temperature, pen-drop test, transmittance and haze. Contrarily, Example 2 applied with the same adhesive layer and PT film as Example 1 but applied with TPO instead of PEBA resin 7 was evaluated as Fail in dynamic folding test in low temperature despite other properties were all good, so delamination and the like might occur when repetitive folding occurred. While, Comparative example 1 applied with PET was evaluated as Fail in all the dynamic and static folding/bending test, so it was rated as having properties not suitable for applying as bendable or rollable cover films. Comparative example 1 showed the result of tests for polyimide film alone, and evaluated as Fail in pen-drop test, so polyimide film alone was rated as what couldn't get impact-protecting effect applicable for cover films.

Hereinabove, the preferred embodiments of the present disclosure have been explained in detail, but the scope of the present disclosure should not be limited thereto, and various modifications and improvements made by a person of ordinary skill in the art with using a basic concept defined by the following claims should also be construed to belong to the scope of the present disclosure.

What is claimed is:

1. A film for display device comprising:
   an elastic layer substantially consisting of PEBA as a resin,
   wherein the elastic layer has a refractive index of 1.48 to 1.58,
   wherein a low temperature damage index is a difference of a tensile elastic modulus and a tensile strength at a certain temperature, and the elastic layer has the low temperature damage index of 300 MPa or more and 1,300 MPa or less at −40° C.,
   wherein the elastic layer has a tensile elastic modulus of 1,200 MPa or less at −10° C., and
   wherein the elastic layer has an in-plane retardation Re of 300 nm or less and a haze of 1.2% or less.

2. The film for display device of claim 1,
   wherein the elastic layer has a storage modulus of 1,500 MPa or less at −40° C.

3. The film for display device of claim 1,
   wherein a roughness reference value of the film is a larger value between Ra1 as a surface roughness Ra value of one side and Ra2 as a surface roughness Ra value of other side, and
   the elastic layer has the roughness reference value of 0.5 μm or less.

4. The film for display device of claim 1,
   wherein the elastic layer has a thickness direction retardation Rth of 3,000 nm or less and a transmittance of visible light of 85% or more.

5. The film for display device of claim 1,
   wherein the elastic layer has an elongation of 200% or more at 20° C.

6. A light transmitting laminate comprising a film according to claim 1.

7. A cover film comprising a film according to claim 1.

8. The cover film of claim 7, further comprising:
   a glass layer disposed on one side or the other side of the elastic layer,
   wherein the glass layer is a tempered glass having a thickness of 200 μm or less.

9. A multi-layered electronic device comprising:
a light emitting functional layer and a film,
wherein the light emitting functional layer has a display area which emits or does not emit light depending on external signals,
the film is according to claim 1, and
the film is disposed on an upper side or a rear side of the display area.

10. A multi-layered electronic device comprising:
a light emitting functional layer and a film,
wherein the light emitting functional layer has a display area which emits or does not emit light depending on external signals,
the film is according to claim 1, and
the film is disposed on one side of the light emitting functional layer and covering at least some of the display area.

11. A method of manufacturing a film comprising:
an operating of forming an elastic sheet from a polymer resin comprising an amide or the residue thereof as a repeating unit; and
an operating of letting a first assembly having the elastic sheet disposed on a carrier film pass between rollers to prepare a second assembly comprising the elastic layer disposed on the carrier film; and
thereby manufacturing a film according to claim 1.

* * * * *